US009825121B2

(12) United States Patent
Iijima et al.

(10) Patent No.: US 9,825,121 B2
(45) Date of Patent: Nov. 21, 2017

(54) SEMICONDUCTOR DEVICE

(71) Applicant: Kabushiki Kaisha Toshiba, Minato-ku (JP)

(72) Inventors: Ryosuke Iijima, Setagaya (JP); Keiko Ariyoshi, Okayama (JP); Tatsuo Shimizu, Shinagawa (JP); Kazuto Takao, Tsukuba (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/970,767

(22) Filed: Dec. 16, 2015

(65) Prior Publication Data
US 2016/0190234 A1 Jun. 30, 2016

(30) Foreign Application Priority Data

Dec. 26, 2014 (JP) ................................. 2014-265339

(51) Int. Cl.
*H01L 29/15* (2006.01)
*H01L 29/04* (2006.01)
(Continued)

(52) U.S. Cl.
CPC ........ *H01L 29/045* (2013.01); *H01L 29/1608* (2013.01); *H01L 29/66068* (2013.01); *H01L 29/78* (2013.01); *H01L 29/7835* (2013.01)

(58) Field of Classification Search
CPC .................................. H01L 29/045; H01L 29/7825; H01L 29/1608
See application file for complete search history.

(56) References Cited

U.S. PATENT DOCUMENTS 5,736,753 A * 4/1998 Ohno .................. H01L 29/1608
257/147
2011/0017998 A1* 1/2011 Nakano ................ H01L 21/046
257/66
(Continued)

FOREIGN PATENT DOCUMENTS

JP 2000-319099 11/2000
JP 2005-340685 A 12/2005
(Continued)

OTHER PUBLICATIONS

Japanese Office Action dated Mar. 8, 2016 in Patent Application No. 2014-265339 (with English language translation).
(Continued)

*Primary Examiner* — Dale E Page
*Assistant Examiner* — Wasiul Haider
(74) *Attorney, Agent, or Firm* — Oblon, McClelland, Maier & Neustadt, L.L.P.

(57) ABSTRACT

A semiconductor device of the embodiment includes an SiC layer of 4H—SiC structure having a surface inclined at an angle from 0 degree to 30 degrees relative to {11-20} face or {1-100} face, a gate electrode, a gate insulating film provided between the surface and the gate electrode, a n-type first SiC region provided in the SiC layer, a n-type second SiC region provided in the SiC layer, a channel forming region provided in the SiC layer between the first SiC region and the second SiC region, the channel forming region provided adjacent to the surface, and the channel forming region having a direction inclined at an angle from 60 degrees to 90 degrees relative to a <0001> direction or a <000-1> direction.

4 Claims, 24 Drawing Sheets

(51) Int. Cl.
*H01L 29/16* (2006.01)
*H01L 29/66* (2006.01)
*H01L 29/78* (2006.01)

(56) References Cited

U.S. PATENT DOCUMENTS

| | | |
|---|---|---|
| 2012/0070605 A1 | 3/2012 | Sasaki et al. |
| 2013/0082282 A1 | 4/2013 | Suzuki |
| 2013/0240906 A1* | 9/2013 | Shimizu ............. H01L 29/1608 257/77 |
| 2013/0285069 A1 | 10/2013 | Yano et al. |
| 2014/0191247 A1 | 7/2014 | Iijima et al. |

FOREIGN PATENT DOCUMENTS

| | | |
|---|---|---|
| JP | 2013-77761 A | 4/2013 |
| JP | 2014-135366 | 7/2014 |
| WO | WO 2011/037079 A1 | 3/2011 |
| WO | WO 2012/026089 A1 | 3/2012 |

OTHER PUBLICATIONS

Hiroshi Yano, et al., "High Channel Mobility in Inversion Layers of 4H—SiC MOSFET's by Utilizing (1120) Face" IEEE Electron Device Letters, vol. 20, No. 12, 1999, pp. 611-613.
Hiroshi Yano et al. "High Channel Mobility in Inversion Layers of 4H—SiC MOSFET's by Utilizing (1120) Face", IEEE Electron Device Letters, vol. 20, No. 12, Dec. 1999, 3 pages.

* cited by examiner

SILICON (Si) FACE
:(0001) FACE a-FACE
:(11-20) FACE m-FACE
:(1-100) FACE

US 9,825,121 B2

SEMICONDUCTOR DEVICE

CROSS-REFERENCE TO RELATED APPLICATION

This application is based upon and claims the benefit of priority from Japanese Patent Application No. 2014-265339, filed on Dec. 26, 2014, the entire contents of which are incorporated herein by reference.

FIELD

Embodiments described herein relate generally to a semiconductor device.

BACKGROUND

Silicon carbide (SiC) is expected to be a material for next generation semiconductor devices. In comparison to silicon (Si), SiC exhibits excellent physical properties such as a band gap of three times larger than that of Si, a breakdown field strength of about ten times larger than that of Si, and a thermal conductivity of about three times larger than that of Si. By utilizing these properties, it is possible to realize a low-loss semiconductor device capable of operating at high temperatures.

When SiC is used to manufacture transistors, it has been known that channel mobility depends on a face orientation. On-resistance of transistors also depends on the face orientation.

DETAILED DESCRIPTION

Figure 1:
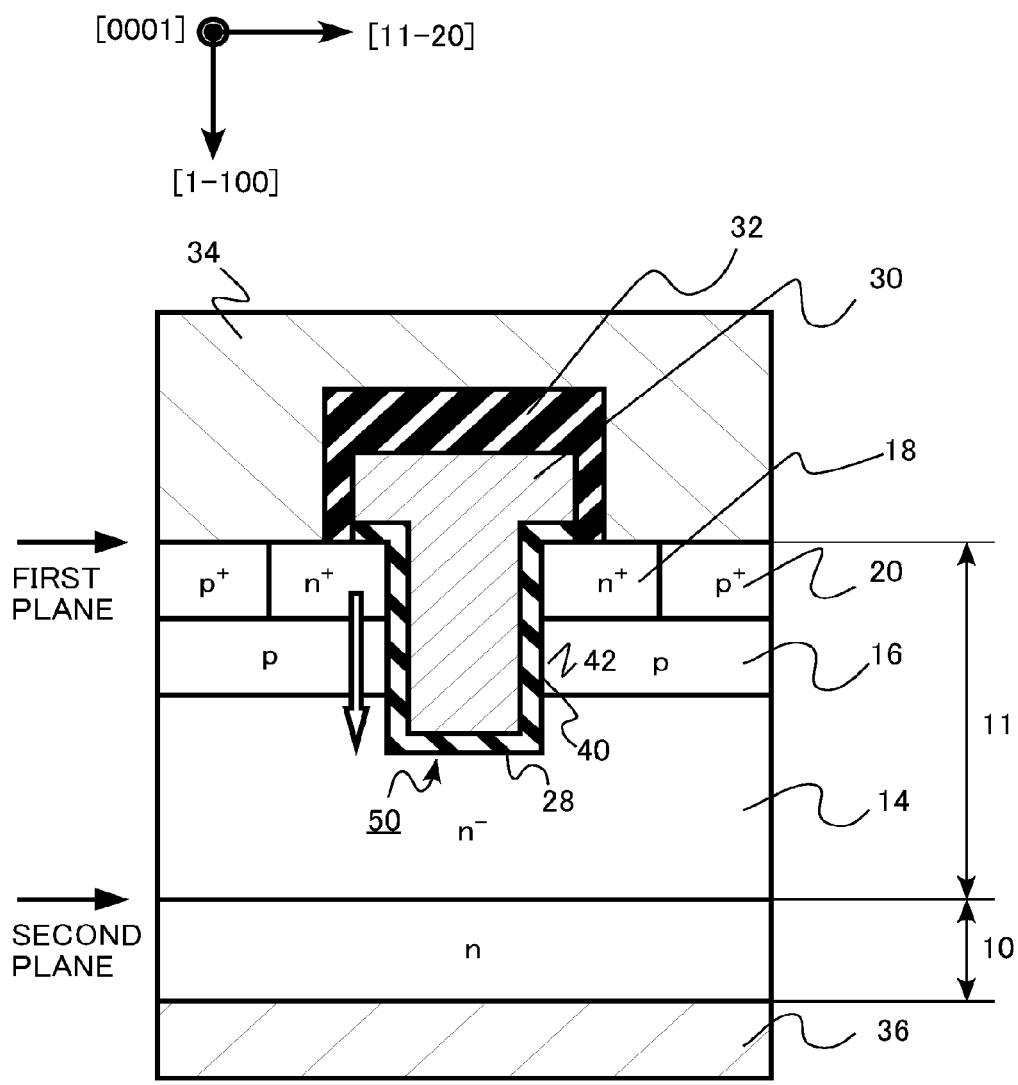
FIG. 1 is a schematic cross-sectional view of a semiconductor device of a first embodiment.

Semiconductor devices of embodiments each include an SiC layer of 4H—SiC structure having a surface inclined at an angle from 0 degree to 30 degrees relative to {11-20} face or {1-100} face, the SiC layer having a first plane and a second plane, the second plane is disposed at an opposite side of the SiC layer to the first plane, a gate electrode, a gate insulating film provided between the surface and the gate electrode, a n-type first SiC region provided in the SiC layer, a n-type second SiC region provided in the SiC layer, a channel forming region provided in the SiC layer between the first SiC region and the second SiC region, the channel forming region provided adjacent to the surface, the channel forming region having a direction inclined at an angle from 60 degrees to 90 degrees relative to a <0001> direction or a <000-1> direction.

Embodiments of the present disclosure will be described below by referring to the accompanying drawings. In the following description, the same reference signs are given to the same or similar members, and the description thereof will not be repeated.

Notations, such as $n^+$, n, $n^-$, $p^+$, p, and $p^-$, indicate relative levels of impurity concentration for each conductivity type. That is, $n^+$ and $n^-$ respectively indicate a relatively higher impurity concentration and a relatively lower impurity concentration of an n-type impurity, $p^+$ and $p^-$ respectively indicate a relatively higher impurity concentration and a relatively lower impurity concentration of a p-type impurity. Both $n^+$-type and $n^-$-type may simply be referred to as the n-type, and both $p^+$-type and $p^-$-type may simply be referred to as the p-type.

Further, it is noted in the following description that the notation such as {11-20} face includes all faces that are crystallographically equivalent to a (11-20) face. Similarly, the notation such as <11-20> direction includes all directions that are crystallographically equivalent to a [11-20] direction.

First Embodiment

A semiconductor device of the present embodiment includes an SiC layer of 4H—SiC structure having a channel forming surface inclined at an angle from 0 degree to 30 degrees relative to {11-20} face or {1-100} face, a gate electrode, a gate insulating film provided between the channel forming surface and the gate electrode, a n-type first SiC region provided in the SiC layer, a n-type second SiC region provided in the SiC layer, and a channel forming region provided on the side of the SiC layer of the channel forming surface and in the SiC layer between the first SiC region and the second SiC region, and having a direction inclined at an angle from 60 degrees to 90 degrees relative to the <0001> direction or the <000-1> direction.

The semiconductor device of the present embodiment includes an SiC layer including a first plane inclined at an angle from 0 degree to 30 degrees relative to the {1-100} face, and a second plane opposite to the first plane and inclined at an angle from 0 degree to 30 degrees relative to the {1-100} face. The channel forming surface is formed between the first and second planes, and inclined at an angle from 0 degree to 30 degrees relative to the {11-20} face. The gate insulating film and the gate electrode are formed in the SiC layer. The semiconductor device also includes a first electrode provided on the side of the first plane and electrically connected to the first SiC region and a second electrode provided on the side of the second plane and electrically connected to the second SiC region.

FIG. 1 is a schematic cross-sectional view illustrating the structure of a metal insulator semiconductor field effect transistor (MISFET) implemented as a semiconductor device of the present embodiment. The MISFET of the present embodiment is a double implantation metal oxide semiconductor field effect transistor (DIMOSFET) in which a base region and a source region are formed by ion implantation. The MISFET is an n-type MISFET that uses electrons as carriers.

The MISFET is also a vertical MISFET having a trench gate structure in which the gate insulating film and the gate electrode are formed in a trench.

The MISFET includes an n-type SiC substrate 10 and an n-type SiC layer 11. In the SiC layer 11, an n$^-$-type drift layer (n-type second SiC region) 14, a p-type base region 16, an n$^+$-type source region (n-type first SiC region) 18, and a p$^+$-type base contact region 20 are formed. The MISFET also includes a gate insulating film 28, a gate electrode 30, an interlayer insulating film 32, a source electrode (first electrode) 34, a drain electrode (second electrode) 36, and a channel forming surface (surface) 40, a channel forming region 42, and a trench 50.

The n-type SiC substrate 10 may be an SiC substrate of 4H—SiC including an n-type impurity, such as nitrogen (N), at an impurity concentration of, for example, from $1\times10^{18}$ cm$^{-3}$ to $1\times10^{20}$ cm$^{-3}$. A top surface side of the n-type SiC substrate 10 is a plane inclined at an angle from 0 degree to 30 degrees relative to a (−1100) face (m-face). A back surface side of the n-type SiC substrate 10 is a face inclined at an angle from 0 degree to 30 degrees relative to a (1-100) face (m-face).

Figure 2:
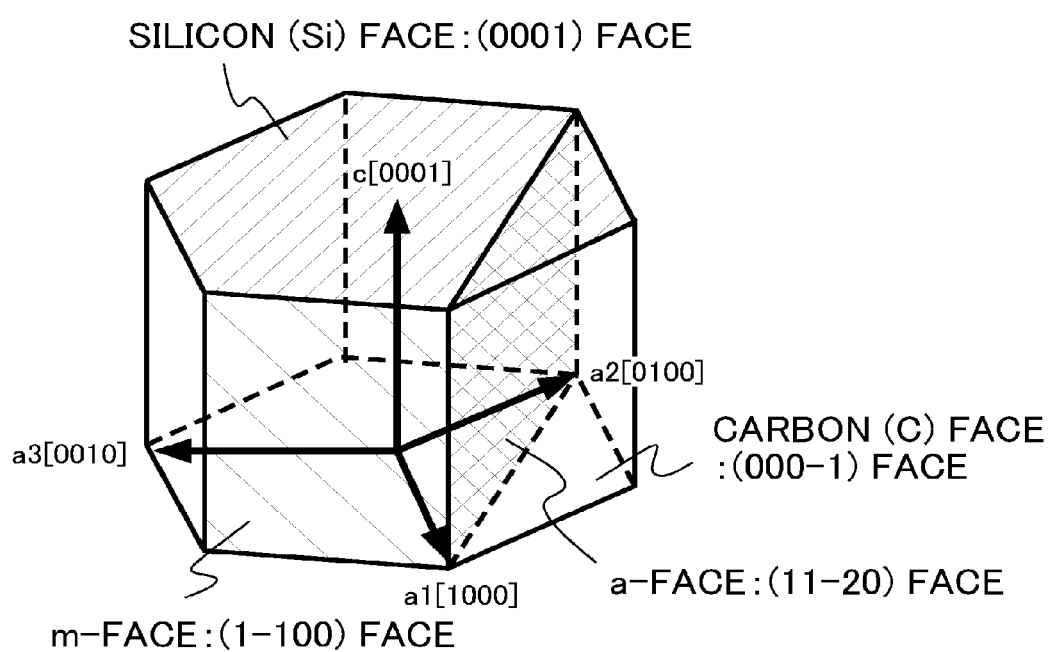
FIG. 2 illustrates the crystal structure of an SiC semiconductor of the first embodiment.
Figure 3:
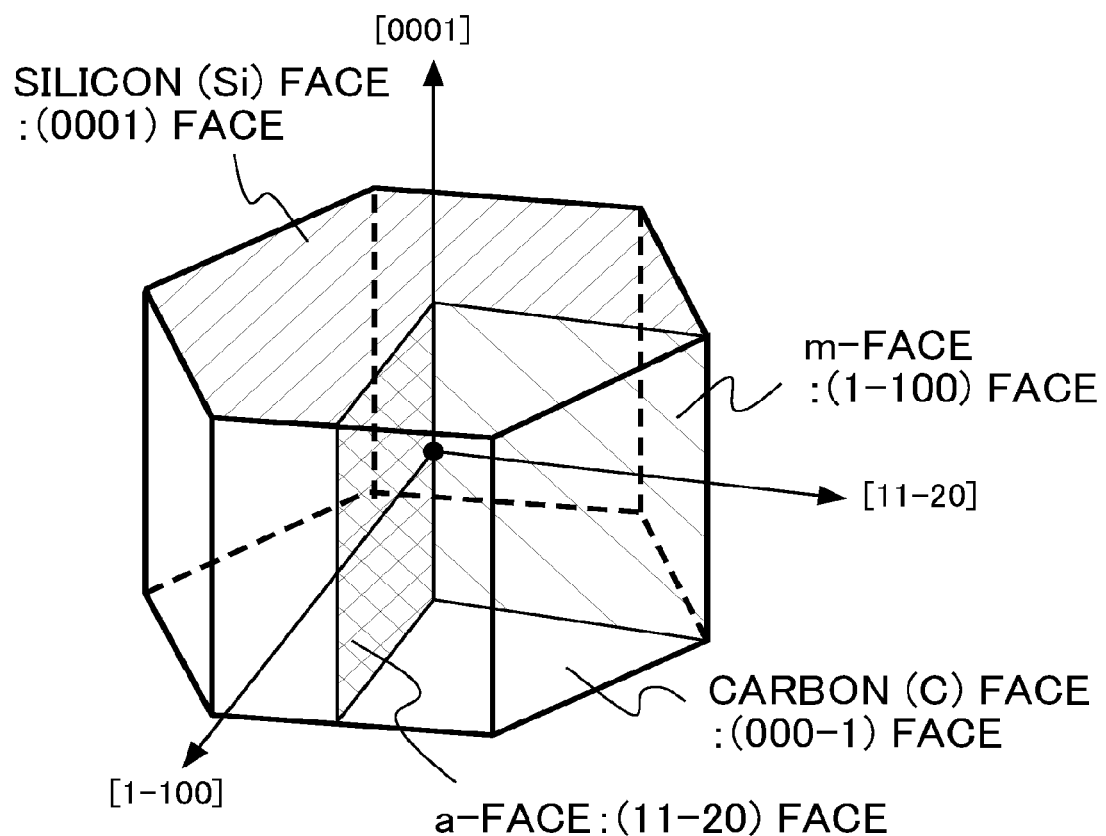
FIG. 3 illustrates the crystal structure of an SiC semiconductor of the first embodiment.

FIGS. 2 and 3 illustrate the crystal structure of an SiC semiconductor. The crystal structure of 4H—SiC has a hexagonal crystal system. A (0001) face is one of top faces (i.e., top faces of a hexagonal prism) with its normal being a c-axis extending along an axial direction of the hexagonal prism. A face equivalent to the (0001) face is referred to as a silicon face (Si face) and represented by {0001} face. Silicon (Si) is disposed on the silicon face.

A (000-1) face is the other of the top faces (i.e., the top faces of the hexagonal prism) with its normal being the c-axis extending along the axial direction of the hexagonal prism. A face equivalent to the (000-1) face is referred to as a carbon face (C-face) and represented by {000-1} face. Carbon (C) is disposed on the carbon face.

Meanwhile, a side face (cylindrical face) of the hexagonal prism is an m-face equivalent to the (1-100) face, that is, the {1-100} face. A face passing a pair of ridgelines that are not adjacent to each other is an a-face equivalent to the (11-20) face, that is, the {11-20} face. Both Si and C are disposed on the m-face and the a-face.

Figure 4A:
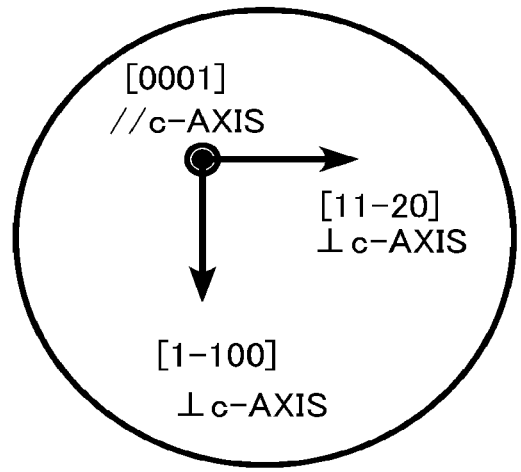
FIGS. 4A to 4C each illustrate crystal faces relative to crystal orientations of the SiC semiconductor of the first embodiment.
Figure 4B:
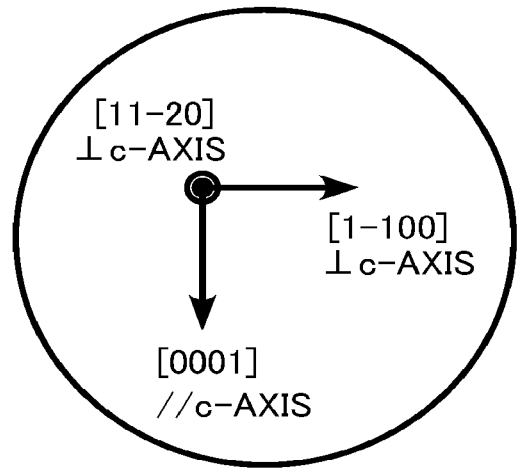
Figure 4C:
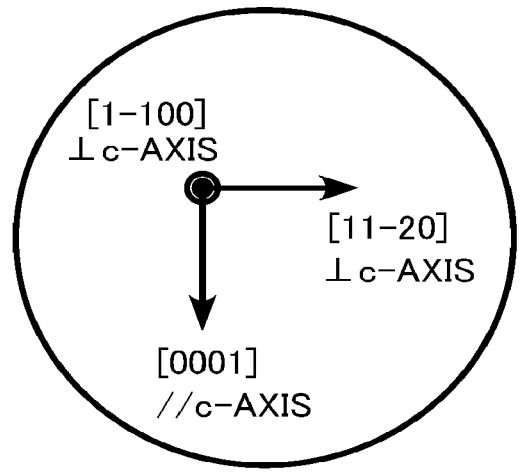

FIGS. 4A to 4C each illustrate a crystal face of the SiC semiconductor relative to crystalline orientation (direction). FIGS. 4A to 4C each illustrate examples of the Si face, the a-face, and the m-face, respectively.

In 4H—SiC, the c-axis extends in a [0001] direction. That is, the [0001] and [000-1] directions are parallel with the c-axis.

As illustrated in FIG. 4A, the [0001] direction is perpendicular to the Si face or the (0001) face. A direction parallel with the Si face, such as the [11-20] or [1-100] direction, is perpendicular to the c-axis.

As illustrated in FIG. 4B, the [11-20] direction is perpendicular to the a-face or the (11-20) face. The [1-100] direction in the a-face is perpendicular to the c-axis.

As illustrated in FIG. 4C, the [1-100] direction is perpendicular to the m-face or the (1-100) face. The [11-20] direction in the m-face is perpendicular to the c-axis.

The SiC layer 11 has the 4H—SiC structure. The SiC layer 11 has first and second planes. The second plane is formed on the side of the SiC layer 11 opposite to the first plane. In FIG. 1, the first plane is the upper surface of the SiC layer 11, and the second plane is the lower surface of the SiC layer 11.

The first plane of the SiC layer 11 is inclined at an angle from 0 degree to 30 degrees relative to the (−1100) face. The second plane of the SiC layer 11 is inclined at an angle from 0 degree to 30 degrees relative to the (1-100) face.

On the SiC substrate 10, the n$^-$-type drift layer (n-type second SiC region) 14 having an impurity concentration of an n-type impurity of, for example, from $5\times10^{15}$ cm$^{-3}$ to $2\times10^{16}$ cm$^{-3}$ is formed. The drift layer 14 is, for example, an SiC epitaxial growth layer formed by epitaxial growth on the SiC substrate 10. The drift layer 14 has a film thickness of, for example, from 5 μm to 100 μm.

In the drift layer 14, the p-type base region 16 having an impurity concentration of a p-type impurity of, for example, from $1\times10^{16}$ cm$^{-3}$ to $5\times10^{17}$ cm$^{-3}$ is formed. A depth of the base region 16 is, for example, about 0.6 μm.

On a part of the surface of the base region 16, the n$^+$-type source region (n-type first SiC region) 18 having an impurity concentration of the n-type impurity of, for example, from $1\times10^{18}$ cm$^{-3}$ to $1\times10^{22}$ cm$^{-3}$ is formed. A depth of the source region 18 is smaller than that of the base region 16 and is, for example, about 0.3 μm. The n$^+$-type source region 18 and the n$^-$-type drift region 14 are formed across the base region 16.

On a part of the surface of the base region 16 and at the side of the source region 18, the p$^+$-type base contact region 20 having an impurity concentration of the p-type impurity of, for example, from $1\times10^{18}$ cm$^{-3}$ to $1\times10^{22}$ cm$^{-3}$ is formed. A depth of the base contact region 20 is smaller than that of the base region 16 and is, for example, about 0.3 μm.

The trench 50 is formed in the surface of the SiC layer 11 in a direction toward the SiC substrate 10 from the surface of the SiC layer 11. An inner wall surface of the trench 50 is inclined at an angle from 0 degree to 30 degrees relative to the {11-20} face or the a-face.

The inner wall surface of the trench 50 becomes the channel forming surface 40. The channel forming surface 40 is formed between the first plane and the second plane.

The gate insulating film 28 and a part of the gate electrode 30 are formed in the trench 50. In other words, the gate insulating film 28 and a part of the gate electrode 30 are formed in the SiC layer 11.

The gate insulating film 28 is formed between the channel forming surface 40 and the gate electrode 30. The gate insulating film 28 includes a film such as a silicon oxide film or a silicon oxynitride film. The gate insulating film 28 may also be made of a high-k insulating film.

The high-k insulating film may include such films as a metal oxide film, a metal oxynitride film, a metal silicate film, a nitrogen added metal silicate film, or the like. Specifically, films such as an aluminum oxide film, a hafnium oxide film, an oxynitride aluminum film, an oxynitride hafnium film, an aluminosilicate film, a hafnium silicate film, a zirconium silicate film, a nitrogen added aluminosilicate film, a nitrogen added hafnium silicate film, a nitrogen added zirconium silicate film, or the like may be used.

From the point of view of suppressing a leak current of the gate insulating film 28, it is preferable to use a film having a larger band gap, such as the silicon oxide film or the silicon nitride film, than that of the high-k insulating film.

From a point of view of decreasing an interface state of the interface between the gate insulating film 28 and the SiC layer 11, a nitride layer may be formed at the interface between the gate insulating film 28 and the SiC layer 11.

The channel forming region 42 is formed on the side of the SiC layer 11 of the channel forming surface 40 in the SiC layer 11. The channel forming region 42 is formed between the n$^+$-type source region (n-type first SiC region) 18 and the n$^-$-type drift layer (n-type second SiC region) 14. The channel forming region 42 is formed in the base region 16. The channel forming region 42 is formed adjacent to the channel forming surface 40. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n$^+$-type source region (n-type first SiC region) 18 and the n$^-$-type drift layer (n-type second SiC region) 14 in the channel forming surface 40. In FIG. 1, the direction of the channel forming region 42 is indicated by a white arrow. The channel forming region 42 is in a direction of, for example, the [1-100] direction.

The gate electrode 30 may be made of, for example, doped polysilicon. The gate electrode 30 may be made of, for example, metal or metal silicide. On the gate electrode 30, an interlayer insulating film 32 made of, for example, the silicon oxide film is formed.

The MISFET includes the conductive source electrode (first electrode) 34 electrically connected to the source region 18 and the base contact region 20 on the side of the first plane of the SiC layer 11. The source electrode 34 also functions as a base electrode that applies a potential to the base region 16.

The source electrode 34 is made of, for example, metal. The source electrode 34 has a layered structure of, for example, a nickel (Ni) layer and an aluminum layer. SiC may be reacted with the nickel layer to create nickel silicide. Similarly, the nickel layer and the aluminum layer may be reacted with each other to form an alloy.

On the side of the second plane of the SiC layer 11 and on the SiC substrate 10 opposite to the drift layer 14, the conductive drain electrode (second electrode) 36 electrically connected to the drift layer 14 and the SiC substrate 10 is formed.

The drain electrode 36 is made of, for example, metal. The source electrode 34 has a layered structure of, for example, a nickel (Ni) layer and an aluminum layer. SiC may be reacted with the nickel layer to create nickel silicide. Similarly, the nickel layer and the aluminum layer may be reacted with each other to form an alloy.

In the present embodiment, nitrogen (N) or phosphorus (P) is preferably used as the n-type impurity, but arsenic (As) or antimony (Sb) may also be used. Aluminum (Al) is preferably used as the p-type impurity, but boron (B), gallium (Ga), or indium (In) may also be used.

Figure 5:
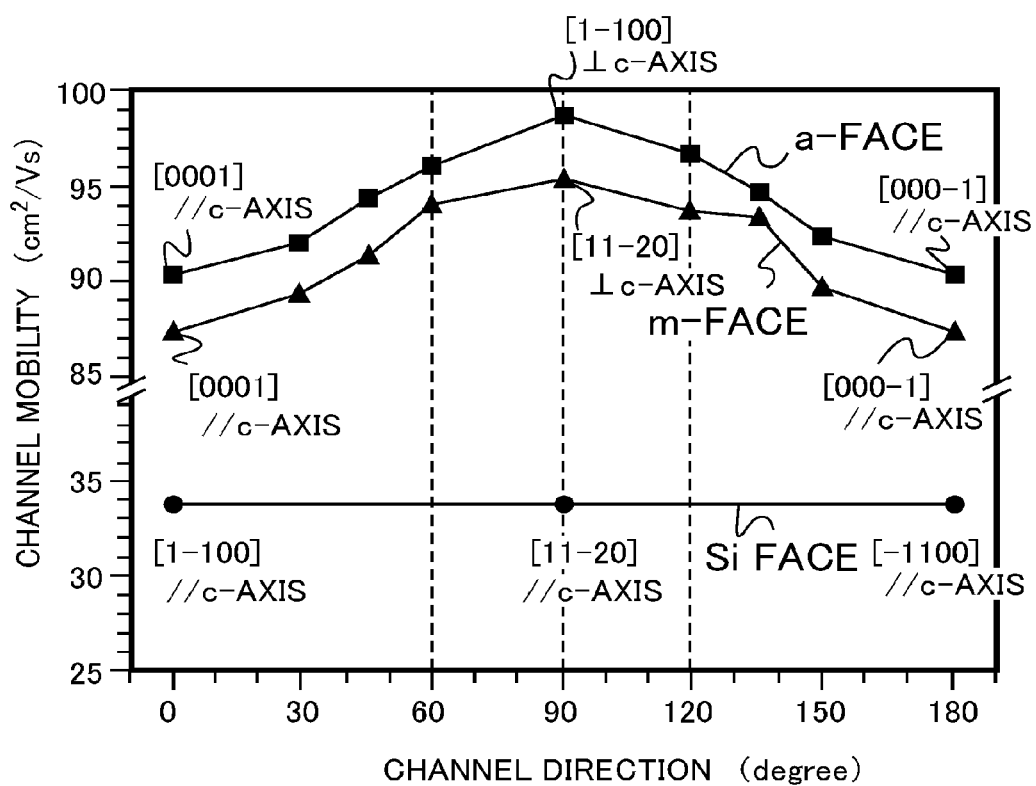
FIG. 5 is an explanatory view illustrating a function and an effect of the first embodiment.
Figure 6:
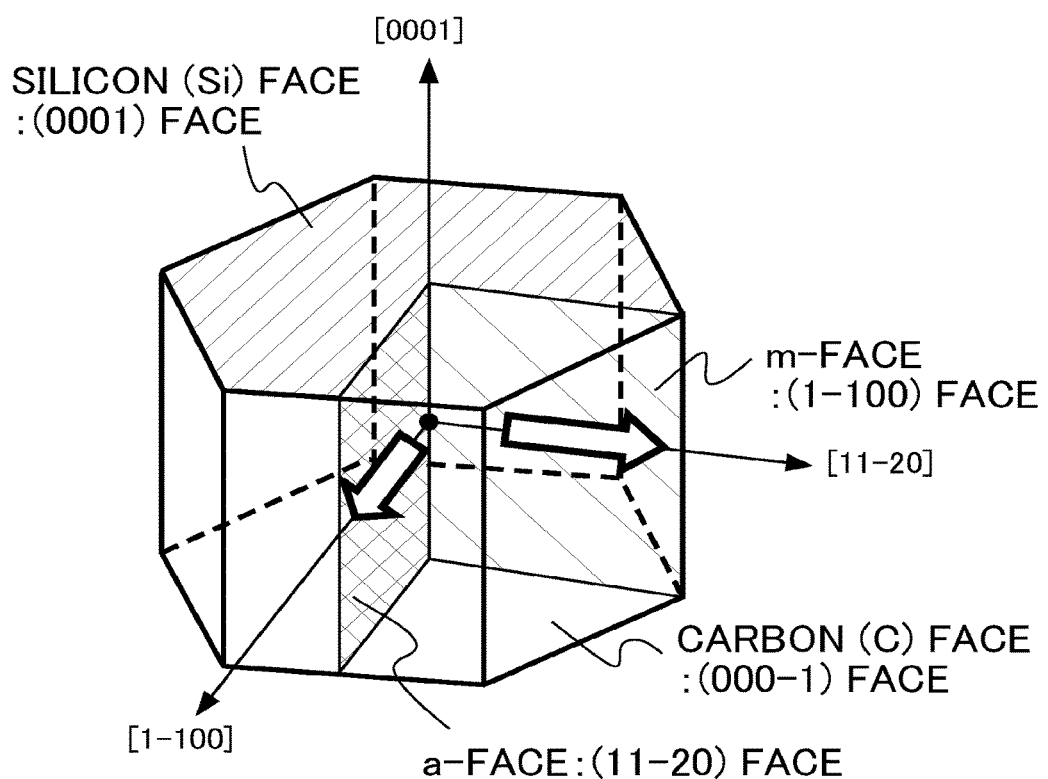
FIG. 6 is an explanatory view illustrating the function and the effect of the first embodiment.

The function and the effect of the semiconductor device of the present embodiment will be described below. FIGS. 5 and 6 are an explanatory diagram and an explanatory view, respectively, illustrating the function and the effect of the semiconductor device of the present embodiment.

FIG. 5 illustrates channel mobility relative to channel directions. The channel mobility dependency on channel directions is illustrated, when the channel is formed on the a-face, the m-face, and the Si-face. A reference channel direction, or 0 degree direction, is set to the [0001] direction in parallel with the c-axis for the a-face, the [0001] direction in parallel with the c-axis for the m-face, and the [1-100] direction for the Si-face.

As can be seen from FIG. 5, the channel mobility highly depends on the channel direction when the channel forming surface is the a-face, and the peak channel mobility is in the [1-100] direction perpendicular to the c-axis. The channel mobility also highly depends on the channel direction when the channel forming surface is the m-face, and the peak channel mobility is in the [11-20] direction perpendicular to the c-axis. In contrast, it is not apparent whether the channel mobility depends on the channel direction when the channel forming surface is the Si-face.

The gate insulating film used in the experiment of FIG. 5 is the silicon oxide film formed by chemical vapor deposition (CVD) and subject to thermal processing in the atmosphere of nitrogen monoxide (NO). A similar trend as in FIG. 5 can be obtained even when the gate insulating film is formed by the silicon oxide film by the CVD and is then subject to thermal processing in a steam atmosphere.

FIG. 6 illustrates directions in which the largest channel mobility is attained for the a-face and the m-face. The directions to attain the largest channel mobility in the a-face and the m-face, that is, the directions perpendicular to the c-axis are indicated by white arrows.

The MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized. Further, the MISFET of the present embodiment has the trench gate structure, such that a highly miniaturized or highly integrated semiconductor device is realized.

From a point of view of improving the channel mobility, the channel forming surface 40 may preferably be inclined at an angle from 0 degree to 15 degrees relative to the {11-20} face (a-face), while the channel forming region 42 may preferably have a direction inclined at an angle from 75 degrees to 90 degrees relative to the <0001> direction (c-axis direction) or the <000-1> direction. Further, from a point of view of improving the channel mobility, the channel forming surface 40 may preferably be inclined at an angle from 0 degree to 5 degrees relative to the {11-20} face (a-face), while the channel forming region 42 may preferably have a direction inclined at an angle from 85 degrees to 90 degrees relative to the <0001> direction (c-axis direction) or the <000-1> direction.

Second Embodiment

A semiconductor device of the present embodiment includes an SiC layer including, a first plane inclined at an angle from 0 degree to 30 degrees relative to the {11-20} face, and a second plane opposite to the first plane and inclined at an angle from 0 degree to 30 degrees relative to the {11-20} face. The channel forming surface is provided between the first and second planes, with the channel forming surface inclined at an angle from 0 degree to 30 degrees relative to the {1-100} face. The gate insulating film and the gate electrode are provided in the SiC layer. The semiconductor device also includes a first electrode provided on the side of the first plane and electrically connected to the first SiC region, and a second electrode provided on the side of the second plane and electrically connected to the second SiC region.

The semiconductor device of the present disclosure differs from that of the first embodiment in directions of the first plane, the second plane, the channel forming surface, and the channel forming region. In the following, what are similar to those of the first embodiment will not be repeated.

Figure 7:
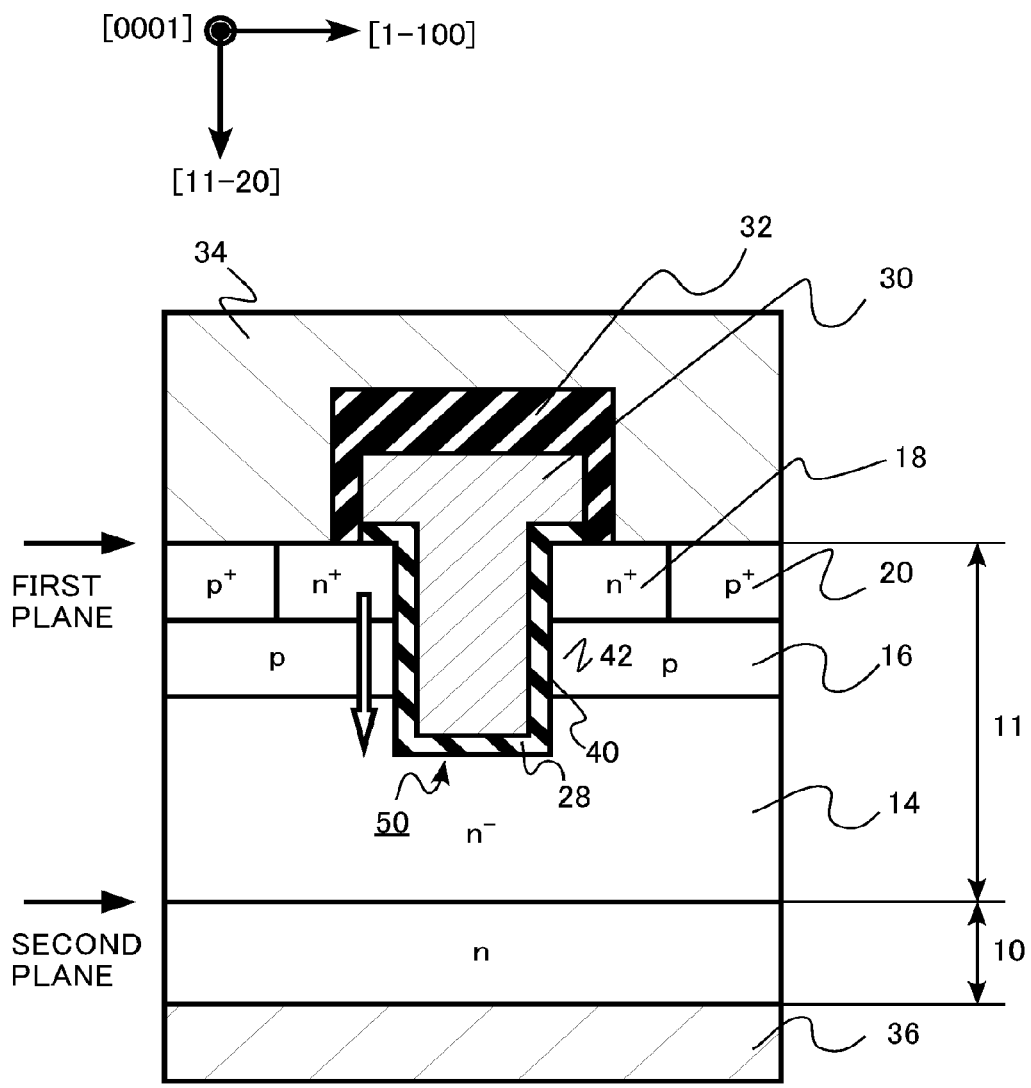
FIG. 7 is a schematic cross-sectional view of a semiconductor device of a second embodiment.

FIG. 7 is a schematic cross-sectional view illustrating the structure of a MISFET implemented as a semiconductor device of the present embodiment. The MISFET of the present embodiment is a DIMOSFET in which base and source regions are formed by ion implantation. The MISFET is an n-type MISFET that uses electrons as carriers.

The MISFET is also a vertical MISFET having a trench gate structure in which the gate insulating film and the gate electrode are formed in a trench.

According to FIG. 5, the channel mobility highly depends on the channel direction when the channel forming surface is formed by the m-face, and the peak channel mobility is in the [11-20] direction perpendicular to the c-axis.

The MISFET of the present embodiment has the channel forming surface 40 inclined at an angle from 0 degree to 30 degrees relative to the {1-100} face (m-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <11-20> direction.

The MISFET with high channel mobility can be realized. Accordingly, the semiconductor device having small on-resistance is realized. Further, the MISFET of the present embodiment has the trench gate structure, such that a highly miniaturized or highly integrated semiconductor device is realized.

From a point of view of improving the channel mobility, the channel forming surface 40 may preferably be inclined at an angle from 0 degree to 15 degrees relative to the {1-100} face (m-face), while the channel forming region 42 may preferably have a direction inclined at an angle from 75 degrees to 90 degrees relative to the <0001> direction (c-axis direction) or the <000-1> direction. Further, from a point of view of improving the channel mobility, the channel forming surface 40 may preferably be inclined at an angle from 0 degree to 5 degrees relative to the {1-100} face (m-face), while the channel forming region 42 may preferably have a direction inclined at an angle from 85 degrees to 90 degrees relative to the <0001> direction (c-axis direction) or the <000-1> direction.

Third Embodiment

A semiconductor device of the present embodiment includes an SiC layer including a first plane inclined at an angle from 0 degree to 30 degrees relative to the {11-20} face, and a second plane opposite to the first plane and inclined at an angle from 0 degree to 30 degrees relative to the {11-20} face. The channel forming surface is included in the first plane. The channel forming surface includes a first electrode provided on the side of the first plane and electrically connected to the first SiC region, and a second electrode provided on the side of the second plane and electrically connected to the second SiC region.

The semiconductor device of the present embodiment differs from that of the first embodiment in that the semiconductor device is a vertical MISFET that does not include the trench structure. In the following, what are similar to those of the first embodiment will not be repeated.

Figure 8:
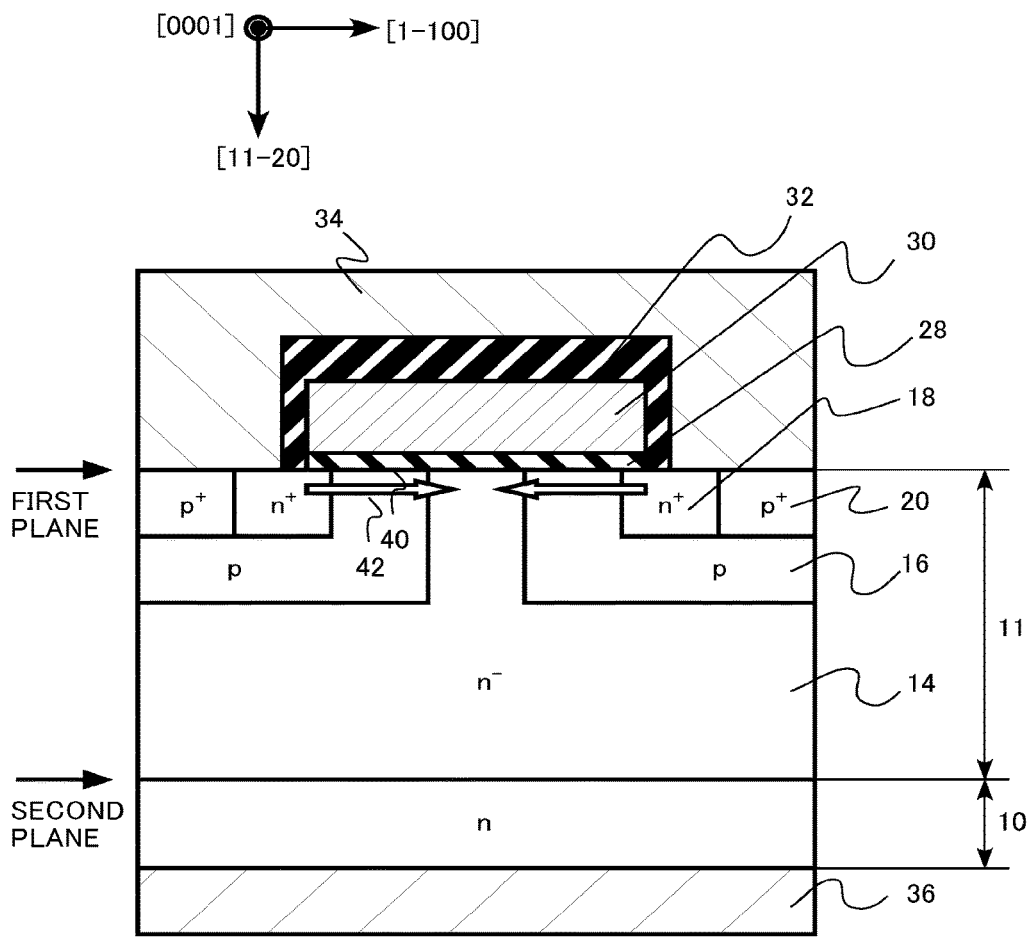
FIG. 8 is a schematic cross-sectional view illustrating a semiconductor device of a third embodiment.

FIG. 8 is a schematic cross-sectional view illustrating the structure of a MISFET implemented as the semiconductor device of the present embodiment. The MISFET of the present embodiment is a DIMOSFET in which base and source regions are formed by ion implantation. The MISFET is an n-type MISFET that uses electrons as carriers.

The MISFET is also a vertical MISFET in which the gate insulating film and the gate electrode are formed on the surface (first plane) of the SiC layer.

The MISFET includes an n-type SiC substrate 10 and an n-type SiC layer 11. In the SiC layer 11, an n⁻-type drift layer (n-type second SiC region) 14, a p-type base region 16, an n⁺-type source region (n-type first SiC region) 18, and a p⁺-type base contact region 20 are formed. The MISFET also includes the gate insulating film 28, the gate electrode 30, the interlayer insulating film 32, the source electrode (first electrode) 34, the drain electrode (second electrode) 36, the channel forming surface 40, and the channel forming region 42.

The n-type SiC substrate 10 may be an SiC substrate of 4H—SiC including an n-type impurity, such as nitrogen (N), at an impurity concentration of, for example, from $1\times10^{18}$ cm$^{-3}$ to $1\times10^{20}$ cm$^{-3}$. A top surface side of the n-type SiC substrate 10 is inclined at an angle from 0 degree to 30 degrees relative to a (−1-120) face (a-face). A back surface side of the n-type SiC substrate 10 is inclined at an angle from 0 degree to 30 degrees relative to the (11-20) face (a-face).

The SiC layer 11 has the 4H—SiC structure. The SiC layer 11 has first and second planes. The second plane is formed on the side of the SiC layer 11 opposite to the first plane. In FIG. 8, the first plane is the upper surface of the SiC layer 11, and the second plane is the lower surface of the SiC layer 11.

The first plane of the SiC layer 11 is inclined at an angle from 0 degree to 30 degrees relative to the (−1-120) face (a-face). The second plane of the SiC layer 11 is inclined at an angle from 0 degree to 30 degrees relative to the (11-20) face (a-face).

On the SiC substrate 10, the n⁻-type drift layer (n-type second SiC region) 14 having an impurity concentration of an n-type impurity of, for example, from $5\times10^{15}$ cm$^{-3}$ to $2\times10^{16}$ cm$^{-3}$ is formed. The drift layer 14 is, for example, an SiC epitaxial growth layer formed by epitaxial growth on the SiC substrate 10. The drift layer 14 has a film thickness of, for example, from 5 μm to 100 μm.

In the drift layer 14, the p-type base region 16 having an impurity concentration of a p-type impurity of, for example, from $1\times10^{16}$ cm$^{-3}$ to $5\times10^{17}$ cm$^{-3}$ is formed. A depth of the base region 16 is, for example, about 0.6 μm.

On a part of the surface of the base region 16, the n⁺-type source region (n-type first SiC region) 18 having an impurity concentration of the n-type impurity of, for example, from $1\times10^{18}$ cm$^{-3}$ to $1\times10^{22}$ cm$^{-3}$ is formed. A depth of the source region 18 is smaller than that of the base region 16 and is, for example, about 0.3 μm. The n⁺-type source region 18 and the n⁻-type drift region 14 are formed across the base region 16.

On a part of the surface of the base region 16 and on the side of the source region 18, the p⁺-type base contact region 20 having an impurity concentration of the p-type impurity of, for example, from $1\times10^{18}$ cm$^{-3}$ to $1\times10^{22}$ cm$^{-3}$ is formed. A depth of the base contact region 20 is smaller than that of the base region 16 and is, for example, about 0.3 μm.

The channel forming surface 40 is included in the first plane. The gate insulating film 28 is formed between the channel forming surface 40 and the gate electrode 30.

The channel forming region 42 is formed on the side of the SiC layer 11 of the channel forming surface 40 in the SiC layer 11. The channel forming region 42 is formed between the n⁺-type source region (n-type first SiC region) 18 and the n⁻-type drift layer (n-type second SiC region) 14. The channel forming region 42 is formed in the base region 16. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n⁺-type source region (n-type first SiC region) 18 and the n⁻-type drift layer (n-type second SiC region) 14 in the channel forming surface 40. In FIG. 8, the direction of the channel forming region 42 is indicated by white arrows. The channel forming region 42 is in a direction of, for example, the [1-100] direction.

On the gate electrode 30, an interlayer insulating film 32 made of, for example, the silicon oxide film is formed.

The MISFET includes the conductive source electrode (first electrode) 34 electrically connected to the source region 18 and the base contact region 20 on the side of the first plane of the SiC layer 11. The source electrode 34 also functions as the base electrode that applies a potential to the base region 16.

On the side of the second plane of the SiC layer 11 and on the SiC substrate 10 opposite to the drift layer 14, the conductive drain electrode (second electrode) 36 electrically connected to the drift layer 14 and the SiC substrate 10 is formed.

Similarly to the first embodiment, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized.

Fourth Embodiment

The semiconductor device of the present embodiment includes an SiC layer including a first plane inclined at an angle from 0 degree to 30 degrees relative to the {1-100} face, and a second plane opposite to the first plane and inclined at an angle from 0 degree to 30 degrees relative to the {1-100} face. The channel forming surface is included in the first plane. The channel forming surface includes a first electrode disposed on the side of the first plane and electrically connected to the first SiC region, and a second electrode disposed on the side of the second plane and electrically connected to the second SiC region.

The semiconductor device of the present embodiment differs from that of the second embodiment in that the semiconductor device is a vertical MISFET that does not have the trench structure. The semiconductor device of the present embodiment also differs from that of the third embodiment in the directions of the first plane, the second plane, the channel forming surface, and the channel forming region. In the following, what are similar to the second or third embodiment will not be repeated.

Figure 9:
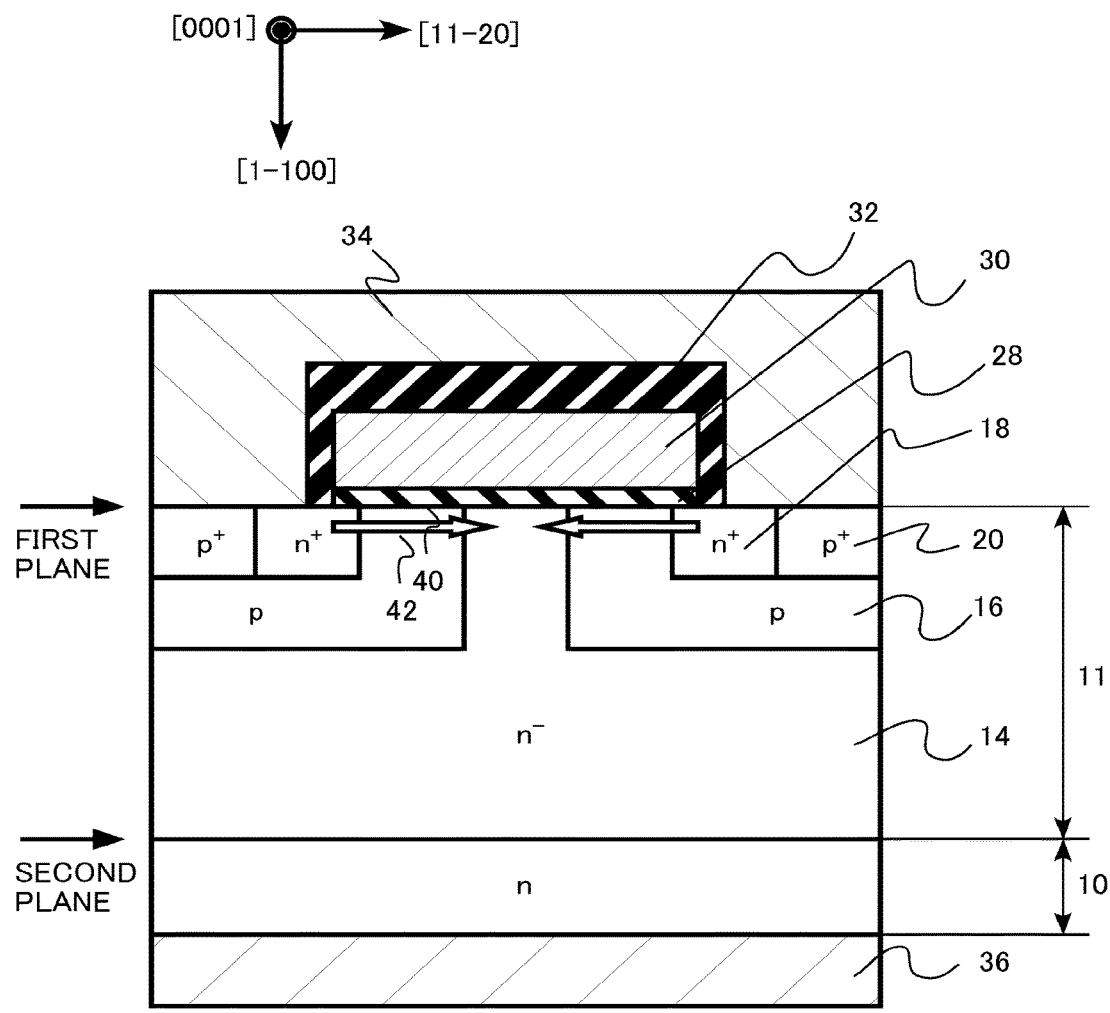
FIG. 9 is a schematic cross-sectional view of a semiconductor device of a fourth embodiment.

FIG. 9 is a schematic cross-sectional view illustrating the structure of a MISFET implemented as the semiconductor device of the present embodiment. The MISFET of the present embodiment is a DIMOSFET in which base and source regions are formed by ion implantation. The MISFET is an n-type MISFET that uses electrons as carriers.

The MISFET is also a vertical MISFET in which the gate insulating film and the gate electrode are formed on the surface (first plane) of the SiC layer.

The MISFET includes an n-type SiC substrate 10 and an n-type SiC layer 11. In the SiC layer 11, an n⁻-type drift layer (n-type second SiC region) 14, a p-type base region 16, an n⁺-type source region (n-type first SiC region) 18, and a p⁺-type base contact region 20 are formed. The MISFET also includes the gate insulating film 28, the gate electrode 30, the interlayer insulating film 32, the source electrode (first electrode) 34, the drain electrode (second electrode) 36, the channel forming surface 40, and the channel forming region 42.

The first plane of the SiC layer 11 is inclined at an angle from 0 degree to 30 degrees relative to the (−1100) face (m-face). The second plane of the SiC layer 11 is inclined at an angle from 0 degree to 30 degrees relative to the (1-100) face (m-face).

The channel forming surface 40 is included in the first plane. The gate insulating film 28 is formed between the channel forming surface 40 and the gate electrode 30.

The channel forming region 42 is formed on the side of the SiC layer 11 of the channel forming surface 40 in the SiC layer 11. The channel forming region 42 is formed between the n⁺-type source region (n-type first SiC region) 18 and the n⁻-type drift layer (n-type second SiC region) 14. The channel forming region 42 is formed in the base region 16. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n⁺-type source region (n-type first SiC region) 18 and the n⁻-type drift layer (n-type second SiC region) 14 in the channel forming surface 40. In FIG. 9, the direction of the channel forming region 42 is indicated by white arrows. The channel forming region 42 is in a direction of, for example, the [11-20] direction.

Similarly to the second embodiment, the MISFET of the present embodiment has the channel forming surface 40 inclined at an angle from 0 degree to 30 degrees relative to the {1-100} face (m-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <11-20> direction.

The MISFET with high channel mobility can be realized. Accordingly, the semiconductor device having small on-resistance is realized.

Fifth Embodiment

A semiconductor device of the present embodiment includes an SiC layer including a first plane inclined at an angle from 0 degree to 30 degrees relative to the {11-20} face, and a second plane opposite to the first plane and inclined at an angle from 0 degree to 30 degrees relative to the {11-20} face. The channel forming surface is included in the first plane. The semiconductor device includes a first electrode provided on the side of the first plane and electrically connected to the first SiC region, and a second electrode provided on the side of the first plane and electrically connected to the second SiC region.

The semiconductor device of the present embodiment differs from those of the first and third embodiments in that the semiconductor device is a lateral MISFET that includes source and drain regions on the same plane. In the following, what are similar to those of the first or third embodiment will not be repeated.

Figure 10:
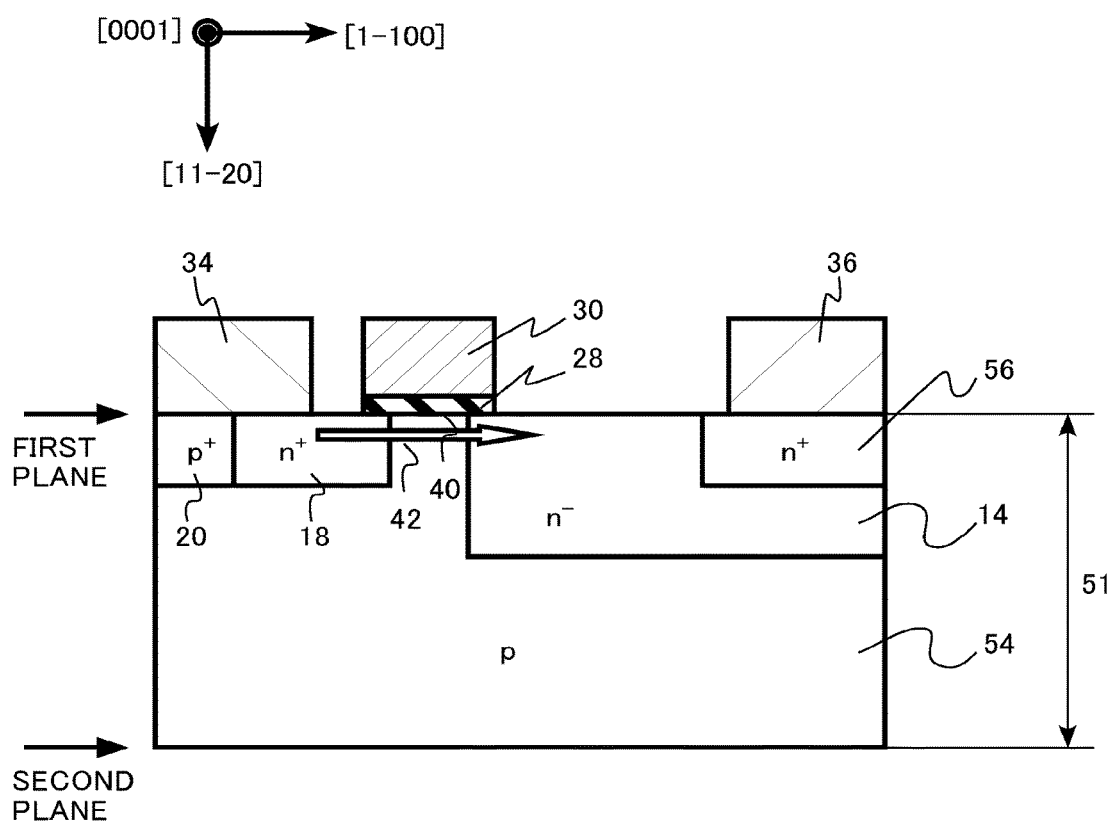
FIG. 10 is a schematic cross-sectional view of a semiconductor device of a fifth embodiment.

FIG. 10 is a schematic cross-sectional view illustrating the structure of a MISFET implemented as the semiconductor device of the present embodiment. The MISFET is an n-type MISFET that uses electrons as carriers.

The MISFET is also a lateral MISFET in which the source region, the gate insulating film, the gate electrode, and the drain region are formed on the surface (first plane) of the SiC layer.

The MISFET includes an SiC layer 51. In the SiC layer 51, a p-type region 54, the n⁻-type drift layer (n-type second SiC region) 14, the n⁺-type source region (n-type first SiC region) 18, the p-type contact region 20, and an n⁺-type drain region 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 has the 4H—SiC structure. The SiC layer 51 has first and second planes. The second plane is formed on the side of the SiC layer 51 opposite to the first plane. In FIG. 10, the first plane is the upper surface of the SiC layer 51, and the second plane is the lower surface of the SiC layer 51.

The first plane of the SiC layer 51 is inclined at an angle from 0 degree to 30 degrees relative to the (−1-120) face (a-face). The second plane of the SiC layer 51 is inclined at an angle from 0 degree to 30 degrees relative to the (11-20) face (a-face).

In the SiC layer 51, the p-type region 54 having an impurity concentration of the p-type impurity of, for example, from $1 \times 10^{16}$ cm⁻³ to $5 \times 10^{17}$ cm⁻³ is formed.

On a part of the surface of the p-type region 54, the n⁻-type drift layer 14 having an impurity concentration of the n-type impurity of, for example, from $5 \times 10^{15}$ cm⁻³ to $2 \times 10^{16}$ cm⁻³ is formed. A depth of the drift layer 14 is, for example, 10 μm.

On a part of the surface of the p-type region 54, the n⁺-type source region (n-type first SiC region) 18 and the n⁺-type drain region 56, both having an impurity concentration of the n-type impurity of, for example, from $1 \times 10^{18}$ cm⁻³ to $1 \times 10^{22}$ cm⁻³ are formed. A depth of the source region 18 and the n⁺-type drain region 56 is smaller than that of the drift layer 14, and is, for example, about 0.3 μm. The n⁺-type source region 18 and the n⁻-type drift region 14 are formed across the p-type region 54.

On a part of the surface of the p-type region 54 and on the side of the source region 18, the p⁺-type contact region 20 having an impurity concentration of the p-type impurity of, for example, from $1 \times 10^{18}$ cm⁻³ to $1 \times 10^{22}$ cm⁻³ is formed. A depth of the p-type contact region 20 is smaller than that of the drift layer 14 and is, for example, about 0.3 μm.

The channel forming surface 40 is included in the first plane. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the n⁺-type source region (n-type first SiC region) 18 and the n⁻-type drift layer (n-type second SiC region) 14. The channel forming region 42 is formed in the p-type region 54. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n+-type source region (n-type first SiC region) 18 and the n−-type drift layer (n-type second SiC region) 14 in the channel forming surface 40. In FIG. 10, the direction of the channel forming region 42 is indicated by a white arrow. The channel forming region 42 is in a direction of, for example, the [1-100] direction.

The MISFET includes the conductive source electrode (first electrode) 34 electrically connected to the source region 18 and the p-type contact region 20 on the side of the first plane of the SiC layer 51. The source electrode 34 also functions as a p-type contact electrode that applies a potential to the p-type region 54.

On the side of the first plane of the SiC layer 51, the conductive drain electrode (second electrode) 36 electrically connected to the n−-type drift layer (n-type second SiC region) 14 and the drain region 56 is formed.

Similarly to the first and third embodiments, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized. Since the drift layer 14 is included, a semiconductor device having high pressure resistance is realized.

Sixth Embodiment

The semiconductor device of the present embodiment includes an SiC layer including a first plane inclined at an angle from 0 degree to 30 degrees relative to the {1-100} face, and a second plane opposite to the first plane and inclined at an angle from 0 degree to 30 degrees relative to the {1-100} face. The channel forming surface is included in the first plane. The semiconductor device includes a first electrode provided on the side of the first plane and electrically connected to the first SiC region, and a second electrode provided on the side of the second plane and electrically connected to the second SiC region.

The semiconductor device of the present embodiment differs from those of the second and fourth embodiments in that the semiconductor device is a lateral MISFET that includes source and drain regions on the same plane. The semiconductor device of the present embodiment also differs from that of the fifth embodiment in the directions of the first plane, the second plane, the channel forming surface, and the channel forming region. In the following, what are similar to those of the second, fourth, or fifth embodiment will not be repeated.

Figure 11:
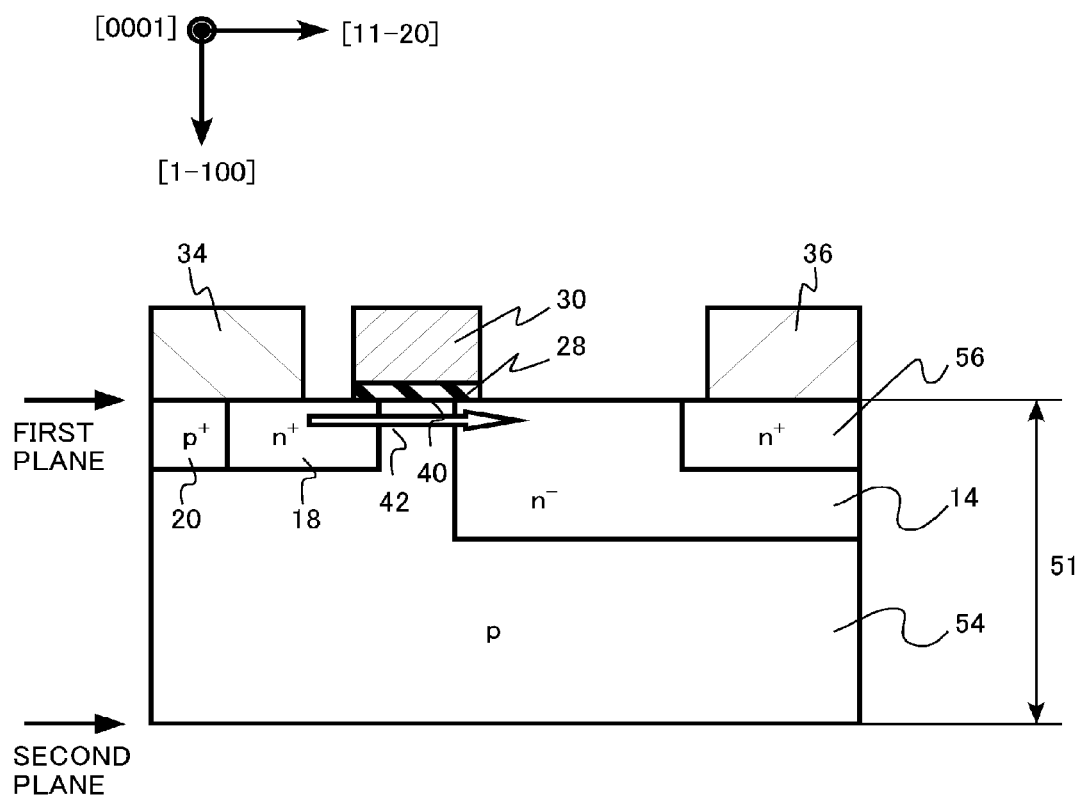
FIG. 11 is a schematic cross-sectional view of a semiconductor device of a sixth embodiment.

FIG. 11 is a schematic cross-sectional view illustrating the structure of a MISFET implemented as the semiconductor device of the present embodiment. The MISFET is an n-type MISFET that uses electrons as carriers.

The MISFET is also a lateral MISFET in which the source region, the gate insulating film, the gate electrode, and the drain region are formed on the surface (first plane) of the SiC layer.

The MISFET includes the SiC layer 51. In the SiC layer 51, a p-type region 54, the n−-type drift layer (n-type second SiC region) 14, the n+-type source region (n-type first SiC region) 18, the p-type contact region 20, and an n+-type drain region 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 has the 4H—SiC structure. The SiC layer 51 has first and second planes. The second plane is formed on the side of the SiC layer 51 opposite to the first plane. In FIG. 11, the first plane is the upper surface of the SiC layer 51, and the second plane is the lower surface of the SiC layer 51.

The first plane of the SiC layer 51 is inclined at an angle from 0 degree to 30 degrees relative to the (−1100) face (m-face). The second plane of the SiC layer 11 is inclined at an angle from 0 degree to 30 degrees relative to the (1-100) face (m-face).

The channel forming surface 40 is included in the first plane. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the n+-type source region (n-type first SiC region) 18 and the n−-type drift layer (n-type second SiC region) 14. The channel forming region 42 is formed in the p-type region 54. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n+-type source region (n-type first SiC region) 18 and the n−-type drift layer (n-type second SiC region) 14 in the channel forming surface 40. In FIG. 11, the direction of the channel forming region 42 is indicated by a white arrow. The channel forming region 42 is in a direction of, for example, the [11-20] direction.

Similarly to the second and fourth embodiments, the MISFET of the present embodiment has the channel forming surface 40 inclined at an angle from 0 degree to 30 degrees relative to the {1-100} face (m-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <11-20> direction.

The MISFET with high channel mobility can be realized. Accordingly, the semiconductor device having small on-resistance is realized. Since the drift layer 14 is included, a semiconductor device having high pressure resistance is realized.

Seventh Embodiment

A semiconductor device of the present embodiment includes an SiC layer including a first plane inclined at an angle from 0 degree to 30 degrees relative to the {11-20} face, and a second plane opposite to the first plane and inclined at an angle from 0 degree to 30 degrees relative to the {11-20} face. The channel forming surface is included in the first plane. The semiconductor device includes a first electrode provided on the side of the first plane and electrically connected to the first SiC region, and a second electrode provided on the side of the second plane and electrically connected to the second SiC region.

The semiconductor device of the present embodiment is a lateral MISFET that includes source and drain regions on the same plane. The semiconductor device differs from that of the fifth embodiment in that a drift layer is not included. In the following, what are similar to those of the fifth embodiment will not be repeated.

Figure 12:
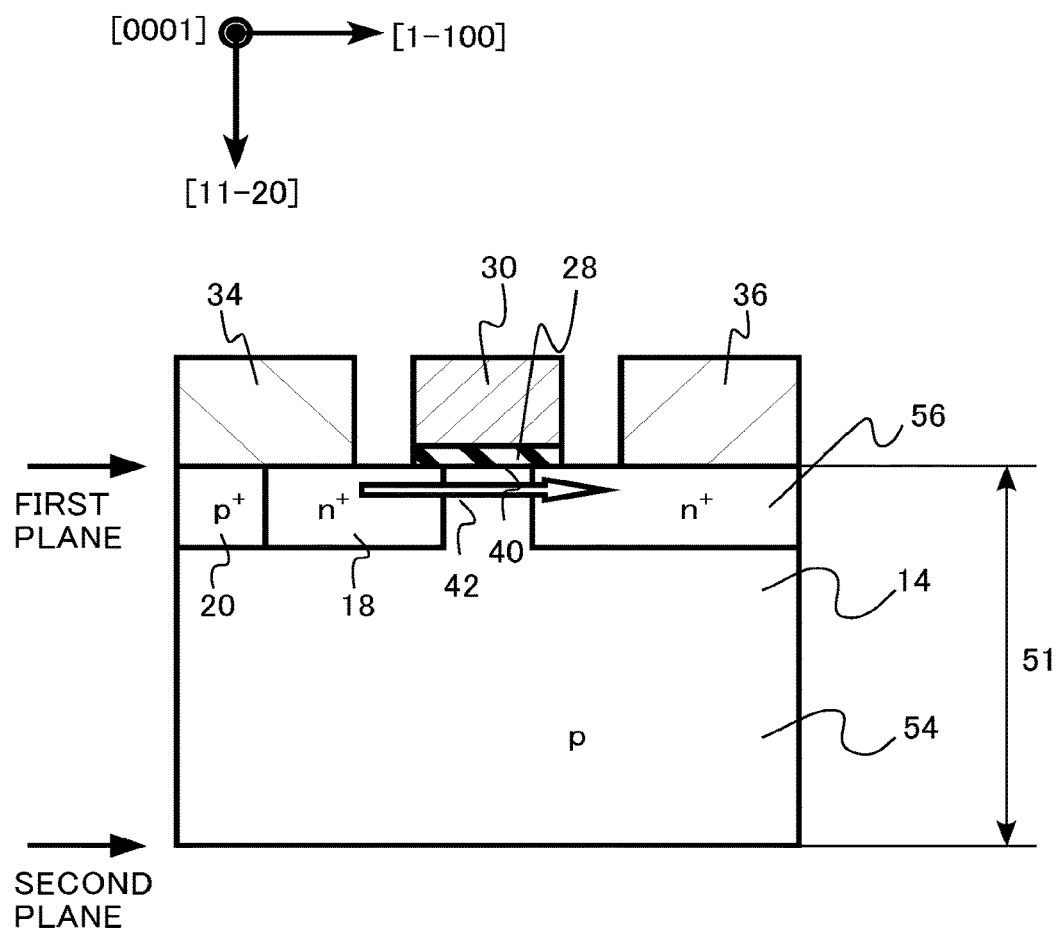
FIG. 12 is a schematic cross-sectional view of a semiconductor device of a seventh embodiment.

FIG. 12 is a schematic cross-sectional view illustrating the structure of a MISFET implemented as the semiconductor device of the present embodiment. The MISFET is an n-type MISFET that uses electrons as carriers.

The MISFET is also a lateral MISFET in which the source region, the gate insulating film, the gate electrode, and the drain region are formed on the surface (first plane) of the SiC layer.

The MISFET includes an SiC layer 51. In the SiC layer 51, the p-type region 54, the n$^+$-type source region (n-type first SiC region) 18, the p-type contact region 20, and the n$^+$-type drain region (n-type second SiC region) 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 has the 4H—SiC structure. The SiC layer 51 has first and second planes. The second plane is formed on the side of the SiC layer 51 opposite to the first plane. In FIG. 12, the first plane is the upper surface of the SiC layer 51, and the second plane is the lower surface of the SiC layer 51.

The first plane of the SiC layer 51 is inclined at an angle from 0 degree to 30 degrees relative to the (-1-120) face (a-face). The second plane of the SiC layer 51 is inclined at an angle from 0 degree to 30 degrees relative to the (11-20) face (a-face).

In the SiC layer 51, the p-type region 54 having an impurity concentration of the p-type impurity of, for example, from $1\times10^{16}$ cm$^{-3}$ to $5\times10^{17}$ cm$^{-3}$ is formed.

On a part of the surface of the p-type region 54, the n$^+$-type source region (n-type first SiC region) 18 and the n$^+$-type drain region (n-type second SiC region) 56, both having an impurity concentration of the n-type impurity of, for example, from $1\times10^{18}$ cm$^{-3}$ to $1\times10^{22}$ cm$^{-3}$ are formed.

A depth of both the source region 18 and the n$^+$-type drain region 56 is, for example, about 0.3 µm. The n$^+$-type source region 18 and the n$^+$-type drain region 56 are formed across the p-type region 54.

On a part of the surface of the p-type region 54 and at the side of the source region 18, the p$^+$-type contact region 20 having an impurity concentration of the p-type impurity of, for example, from $1\times10^{18}$ cm$^{-3}$ to $1\times10^{22}$ cm$^{-3}$ is formed. A depth of the p-type contact region 20 is, for example, about 0.3 µm.

The channel forming surface 40 is included in the first plane. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the n$^+$-type source region (n-type first SiC region) 18 and the n$^+$-type drain region (n-type second SiC region) 56. The channel forming region 42 is formed in the p-type region 54. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The direction of the channel forming region 42 of the present embodiment is the direction of a line segment formed by connecting such points as to minimize a distance between the n$^+$-type source region (n-type first SiC region) 18 and the n$^+$-type drain region (n-type second SiC region) 56 in the channel forming surface 40. In FIG. 12, the direction of the channel forming region 42 is indicated by a white arrow. The channel forming region 42 is in a direction of, for example, the [1-100] direction.

The MISFET includes the conductive source electrode (first electrode) 34 electrically connected to the source region 18 and the p-type contact region 20 on the side of the first plane of the SiC layer 51. The source electrode 34 also functions as a p-type contact electrode that applies a potential to the p-type region 54.

On the side of the first plane of the SiC layer 51, the conductive drain electrode (second electrode) 36 electrically connected to the drain region 56 is formed.

Similarly to the fifth embodiment, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized.

Eighth Embodiment

The semiconductor device of the present embodiment includes an SiC layer including a first plane inclined at an angle from 0 degree to 30 degrees relative to the {1-100} face, and a second plane opposite to the first plane and inclined at an angle from 0 degree to 30 degrees relative to the {1-100} face. The channel forming surface is included in the first plane. The semiconductor device includes a first electrode provided on the side of the first plane and electrically connected to the first SiC region, and a second electrode provided on the side of the second plane and electrically connected to the second SiC region.

The semiconductor device of the present embodiment is a lateral MISFET that includes source and drain regions on the same plane. The semiconductor device differs from that of the sixth embodiment in that a drift layer is not included. The semiconductor device of the present embodiment also differs from that of the seventh embodiment in the directions of the first plane, the second plane, the channel forming surface, and the channel forming region. In the following, what are similar to those of the sixth or seventh embodiment will not be repeated.

Figure 13:
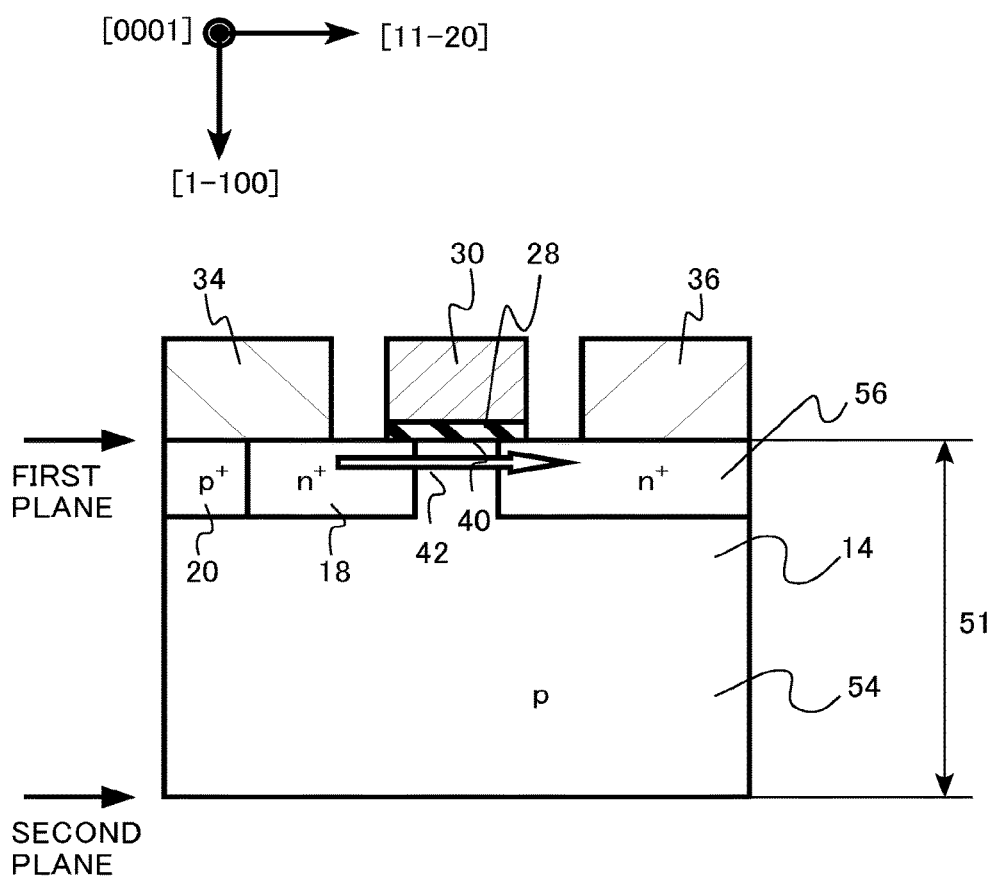
FIG. 13 is a schematic cross-sectional view of a semiconductor device of an eighth embodiment.

FIG. 13 is a schematic cross-sectional view illustrating the structure of a MISFET implemented as the semiconductor device of the present embodiment. The MISFET is an n-type MISFET that uses electrons as carriers.

The MISFET is also a lateral MISFET in which the source region, the gate insulating film, the gate electrode, and the drain region are formed on the surface (first plane) of the SiC layer.

The MISFET includes an SiC layer 51. In the SiC layer 51, the p-type region 54, the $n^+$-type source region (n-type first SiC region) 18, the p-type contact region 20, and the $n^+$-type drain region (n-type second SiC region) 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 has the 4H—SiC structure. The SiC layer 51 has first and second planes. The second plane is formed on the side of the SiC layer 51 opposite to the first plane. In FIG. 13, the first plane is the upper surface of the SiC layer 51, and the second plane is the lower surface of the SiC layer 51.

The first plane of the SiC layer 51 is inclined at an angle from 0 degree to 30 degrees relative to the (−1100) face (m-face). The second plane of the SiC layer 11 is inclined at an angle from 0 degree to 30 degrees relative to the (1-100) face (m-face).

The channel forming surface 40 is included in the first plane. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the $n^+$-type source region (n-type first SiC region) 18 and the $n^+$-type drain region (n-type second SiC region) 56. The channel forming region 42 is formed in the p-type region 54. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The direction of the channel forming region 42 of the present embodiment is the direction of a line segment formed by connecting such points as to minimize a distance between the $n^+$-type source region (n-type first SiC region) 18 and the $n^+$-type drain region (n-type second SiC region) 56 in the channel forming surface 40. In FIG. 13, the direction of the channel forming region 42 is indicated by a white arrow. The channel forming region 42 is in a direction of, for example, the [11-20] direction.

Similarly to the sixth embodiment, the MISFET of the present embodiment has the channel forming surface 40 inclined at an angle from 0 degree to 30 degrees relative to the {1-100} face (m-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <11-20> direction.

The MISFET with high channel mobility can be realized. Accordingly, the semiconductor device having small on-resistance is realized.

Ninth Embodiment

A semiconductor device of the present embodiment includes an SiC layer of 4H—SiC structure having a channel forming surface inclined at an angle from 0 degree to 30 degrees relative to {11-20} face or {1-100} face, a gate electrode, a gate insulating film formed between the channel forming surface and the gate electrode, a n-type first SiC region formed in the SiC layer, a n-type second SiC region formed in the SiC layer, and a channel forming region formed on the side of the SiC layer of the channel forming surface and in the SiC layer between the first SiC region and the second SiC region, and having a direction inclined at an angle from 60 degrees to 90 degrees relative to the <0001> direction or the <000-1> direction.

The semiconductor device of the present embodiment includes an SiC layer including a first plane inclined at an angle from 0 degree to 30 degrees relative to {0001} face or {000-1} face, and a second plane opposite to the first plane and inclined at 0 degree to 30 degrees relative to the {000-1} face or the {0001} face. On the side of the first plane, the SiC layer includes a narrow portion and a wide portion wider than the narrow portion. The channel forming surface is included in a side surface of the narrow portion. The semiconductor device also includes a first electrode provided on the side of the first plane and electrically connected to the first SiC region, and a second electrode provided on the side of the second plane and electrically connected to the second SiC region.

The semiconductor device of the present embodiment differs from that of the third embodiment in that a so-called fin structure is included in which the channel forming region is formed in the narrow portion of the SiC layer. In the following, what are similar to those of the third embodiment will not be repeated.

Figure 14:
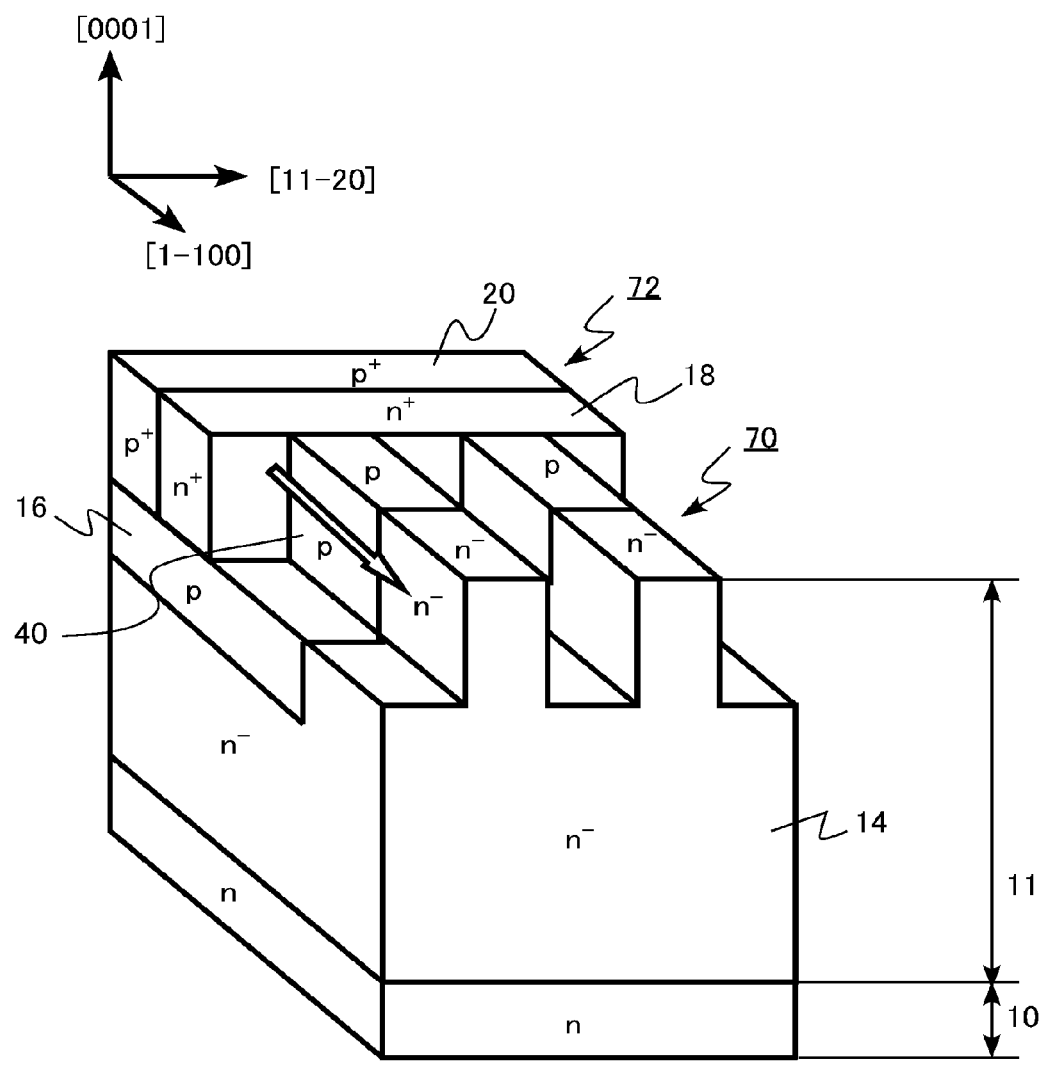
FIG. 14 is a schematic perspective view of a semiconductor device of a ninth embodiment.
Figure 15:
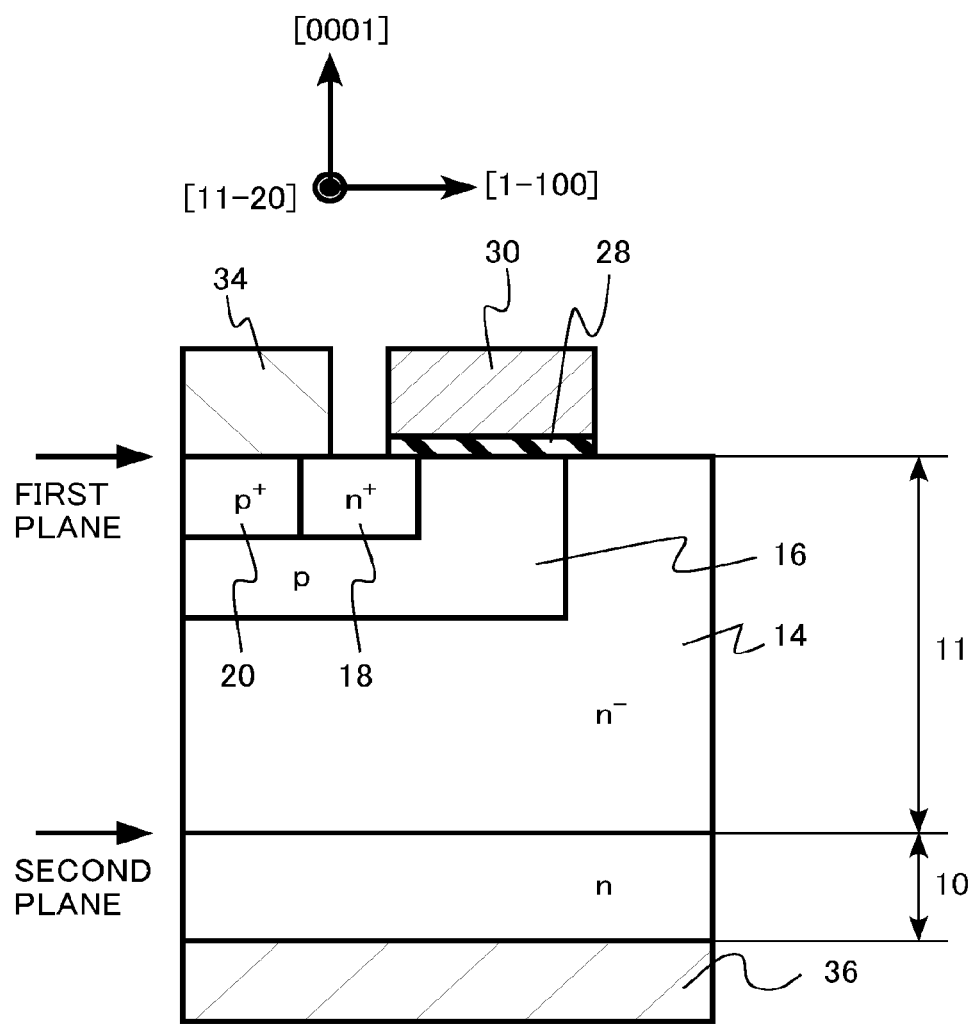
FIG. 15 is a schematic cross-sectional view of a semiconductor device of the ninth embodiment.
Figure 16:
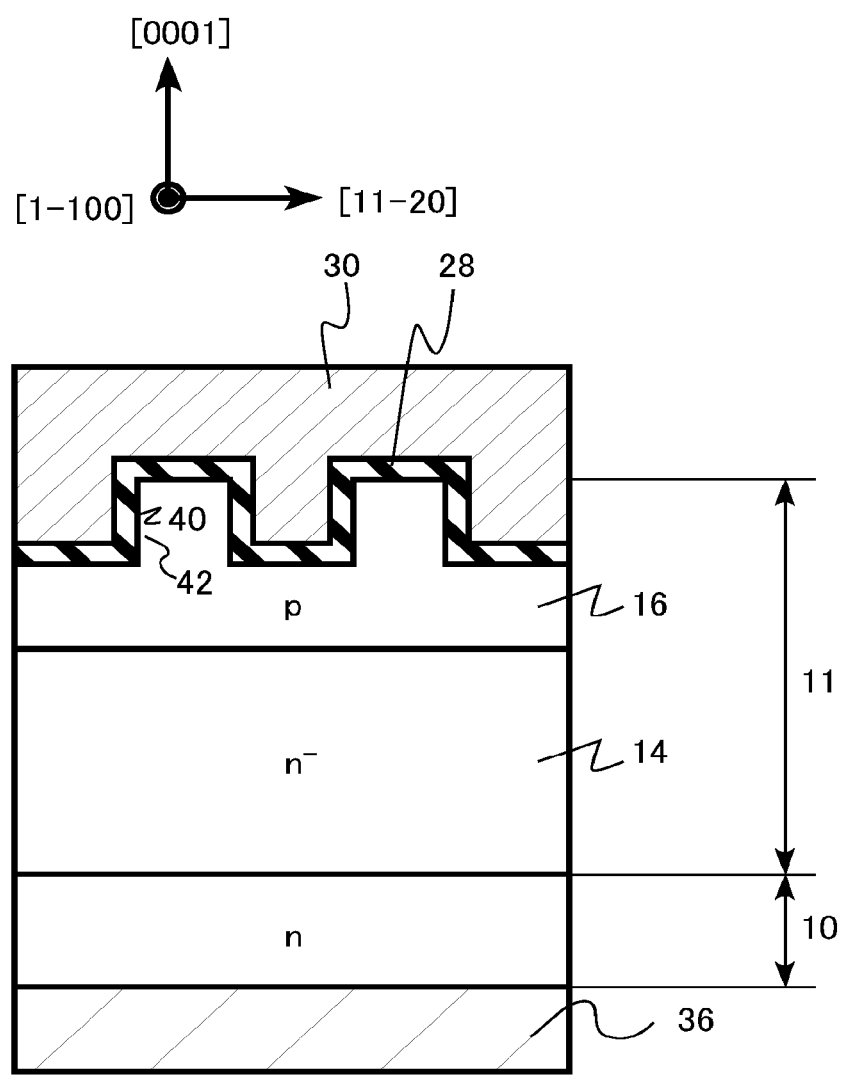
FIG. 16 is a schematic cross-sectional view of a semiconductor device of the ninth embodiment.

FIG. 14 is a schematic perspective view illustrating the structure of a MISFET implemented as the semiconductor device of the present embodiment. FIGS. 15 and 16 are schematic cross-sectional views illustrating the structure of a MISFET implemented as the semiconductor device of the present embodiment. FIG. 15 is a cross-sectional view parallel with the channel direction, and FIG. 16 is a cross-sectional view perpendicular to the channel direction.

The MISFET of the present embodiment is a DIMOSFET in which base and source regions are formed by ion implantation. The MISFET is an n-type MISFET that uses electrons as carriers.

The MISFET is also a vertical MISFET having the fin structure in which the gate insulating film and the gate electrode are formed on the narrow portion of the SiC layer. In the following, the SiC layer including the channel forming surface inclined at an angle of from 0 degree to 30 degrees relative to the {11-20} face will be described as an example.

The MISFET includes an n-type SiC substrate 10 and an n-type SiC layer 11.

The n-type SiC substrate 10 may be an SiC substrate of 4H—SiC including an n-type impurity, such as nitrogen (N), at an impurity concentration of, for example, from $1\times10^{18}$ $cm^{-3}$ to $1\times10^{20}$ $cm^{-3}$.

The SiC layer 11 has the 4H—SiC structure. The SiC layer 11 has first and second planes. The second plane is formed on the side of the SiC layer 11 opposite to the first plane. In FIGS. 14 to 16, the first plane is the upper surface of the SiC layer 11, and the second plane is the lower surface of the SiC layer 11.

In the following, the SiC layer that includes a first plane inclined at an angle from 0 degree to 30 degrees relative to the {0001} face (Si-face), and a second plane opposite to the first plane and inclined at an angle from 0 degree to 30 degrees relative to the {000-1} face (C-face) will be described as an example. For example, the first plane of the SiC layer 11 is inclined at an angle from 0 degree to 30 degrees relative to the (0001) face (Si-face). The second plane of the SiC layer 11 is inclined at an angle from 0 degree to 30 degrees relative to the (000-1) face (C-face).

In the SiC layer 11, an n⁻-type drift layer (n-type second SiC region) 14, a p-type base region 16, an n⁺-type source region (n-type first SiC region) 18, and a p⁺-type base contact region 20 are formed. The MISFET also includes the gate insulating film 28, the gate electrode 30, the source electrode (first electrode) 34, the drain electrode (second electrode) 36, the channel forming surface 40, and the channel forming region 42.

The SiC layer 11 includes a narrow portion 70 and a wide portion 72 wider than the narrow portion on the side of the first plane of the Si layer 11.

On the SiC substrate 10, the n⁻-type drift layer (n-type second SiC region) 14 having an impurity concentration of an n-type impurity of, for example, from $5\times10^{15}$ $cm^{-3}$ to $2\times10^{16}$ $cm^{-3}$ is formed. The drift layer 14 is, for example, an SiC epitaxial growth layer formed by epitaxial growth on the SiC substrate 10. The drift layer 14 has a film thickness of, for example, from 5 µm to 100 µm.

In the drift layer 14, the p-type base region 16 having an impurity concentration of a p-type impurity of, for example, from $1\times10^{16}$ $cm^{-3}$ to $5\times10^{17}$ $cm^{-3}$ is formed. A depth of the base region 16 is, for example, about 0.6 µm.

On a part of the surface of the base region 16, the n⁺-type source region (n-type first SiC region) 18 having an impurity concentration of the n-type impurity of, for example, from $1\times10^{18}$ $cm^{-3}$ to $1\times10^{22}$ $cm^{-3}$ is formed. A depth of the source region 18 is smaller than that of the base region 16 and is, for example, about 0.3 µm. The n⁺-type source region 18 and the n⁻-type drift region 14 are formed across the base region 16.

On a part of the surface of the base region 16 and on the side of the source region 18, the p⁺-type base contact region 20 having an impurity concentration of the p-type impurity of, for example, from $1\times10^{18}$ $cm^{-3}$ to $1\times10^{22}$ $cm^{-3}$ is formed.

A depth of the base contact region 20 is smaller than that of the base region 16 and is, for example, about 0.3 µm.

The channel forming surface 40 is included in the side face of the narrow portion 70. The gate insulating film 28 is formed between the channel forming surface 40 and the gate electrode 30.

The channel forming region 42 is formed on the side of the SiC layer 11 of the channel forming surface 40 in the SiC layer 11. The channel forming region 42 is formed between the n⁺-type source region (n-type first SiC region) 18 and the n⁻-type drift layer (n-type second SiC region) 14. The channel forming region 42 is formed in the base region 16. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n⁺-type source region (n-type first SiC region) 18 and the n⁻-type drift layer (n-type second SiC region) 14 in the channel forming surface 40. In FIG. 14, the direction of the channel forming region 42 is indicated by a white arrow. The channel forming region 42 is in a direction of, for example, the [1-100] direction.

The MISFET includes the conductive source electrode (first electrode) 34 electrically connected to the source region 18 and the base contact region 20 on the side of the first plane of the SiC layer 11. The source electrode 34 also functions as a base electrode that applies a potential to the base region 16.

On the side of the second plane of the SiC layer 11 and on the SiC substrate 10 opposite to the drift layer 14, the conductive drain electrode (second electrode) 36 electrically connected to the drift layer 14 and the SiC substrate 10 is formed.

Similarly to the third embodiment, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized. The MISFET of the present embodiment includes the fin structure, and can suppress short channel effect. As a result, the gate length of the MISFET can be decreased. Accordingly, a highly miniaturized or integrated semiconductor device is realized.

Although the example of the SiC layer including the channel forming surface inclined at an angle from 0 degree to 30 degrees relative to the {11-20} face (a-face) has been described, the SiC layer including the channel forming surface inclined at an angle from 0 degree to 30 degrees relative to the {1-100} face (m-face) may also be used. With such an SiC layer, the semiconductor device with small on-resistance is also realized.

Further, the example of the SiC layer including the first plane inclined at an angle from 0 degree to 30 degrees relative to the {0001} face (Si-face) and the second plane opposite to the first plane and inclined at an angle from 0 degree to 30 degrees relative to the {000-1} face (C-face) has been described above. However, the SiC layer including the first plane inclined at an angle from 0 degree to 30 degrees relative to the {000-1} face (C-face) and the second plane opposite to the first plane and inclined at an angle from 0 degree to 30 degrees relative to the {0001} face (Si-face) may also be used. With such an SiC layer, the semiconductor device with small on-resistance is also realized.

Tenth Embodiment

The semiconductor device of the present embodiment differs from that of the ninth embodiment in that the semiconductor device is a lateral MISFET that includes source and drain regions on the same plane. In the following, what are similar to those of the ninth embodiment will not be repeated.

The semiconductor device of the present embodiment includes a so-called fin structure in which the channel forming region is formed in the narrow portion of the SiC layer.

Figure 17:
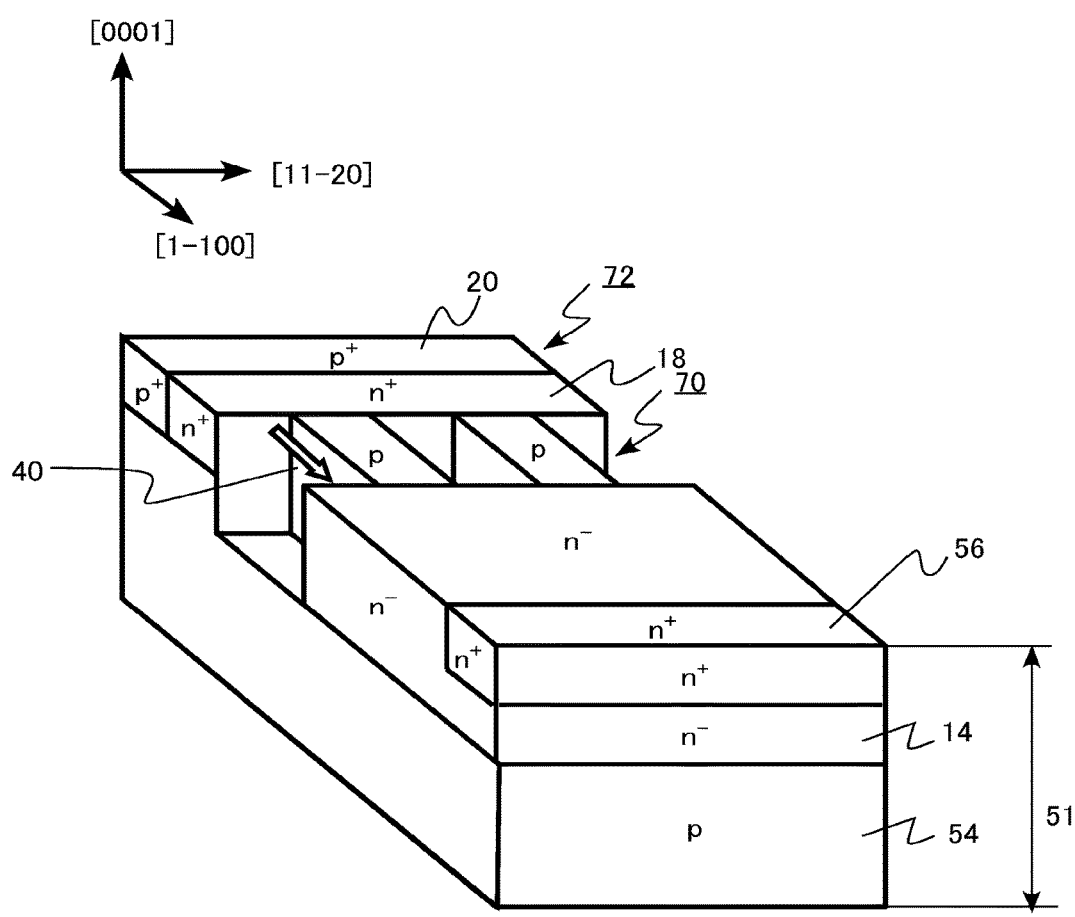
FIG. 17 is a schematic perspective view of a semiconductor device of a tenth embodiment.
Figure 18:
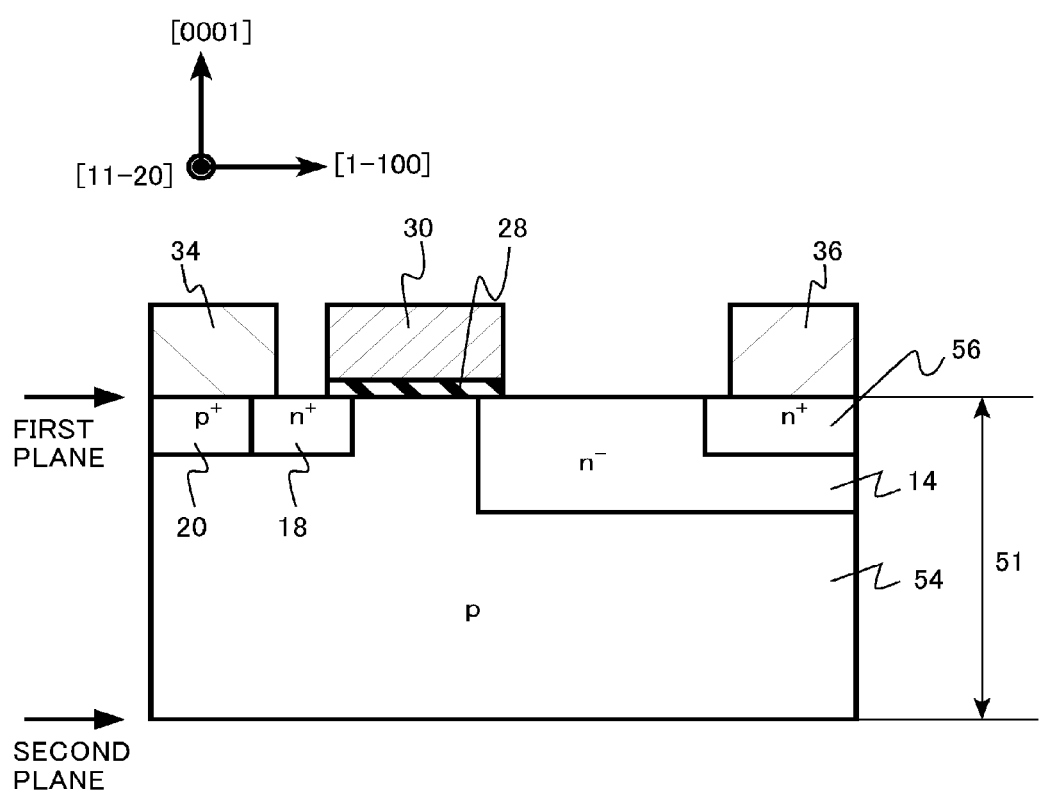
FIG. 18 is a schematic cross-sectional view of a semiconductor device of the tenth embodiment.
Figure 19:
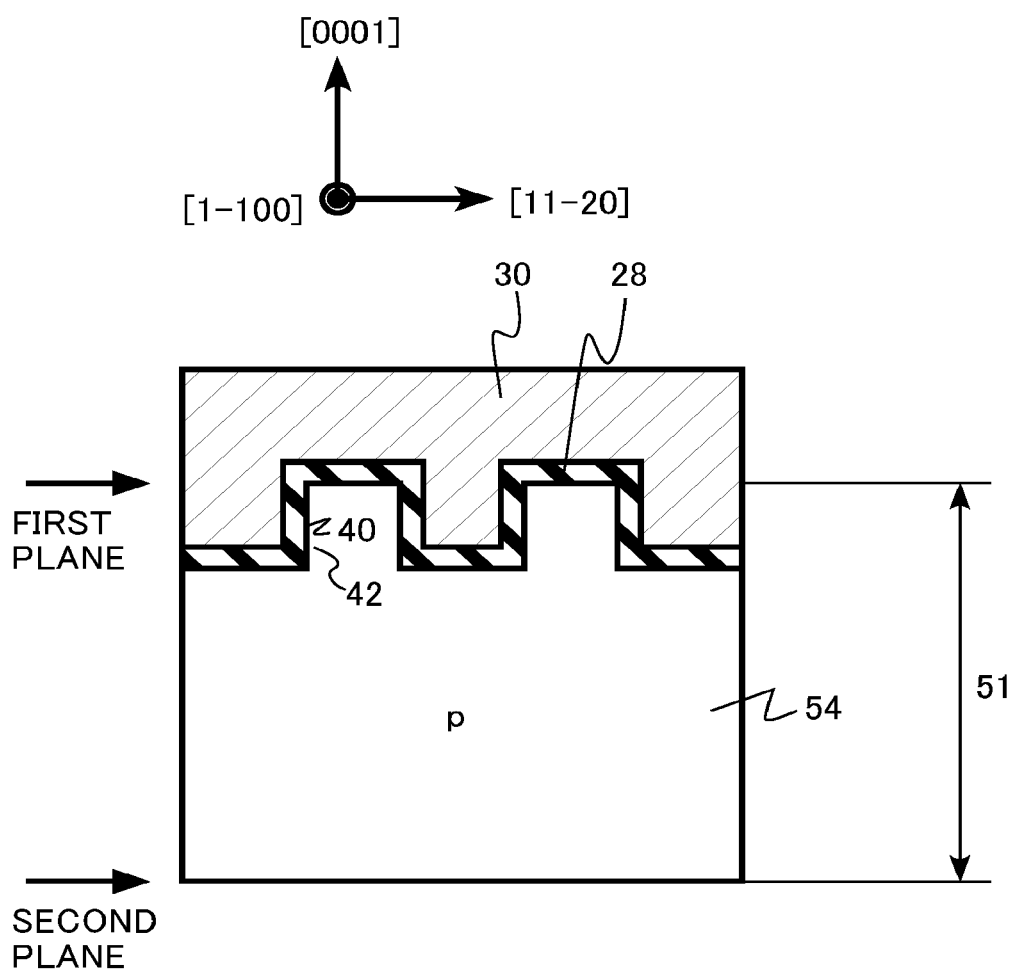
FIG. 19 is a schematic cross-sectional view of a semiconductor device of the tenth embodiment.

FIG. 17 is a schematic perspective view illustrating the structure of a MISFET implemented as the semiconductor device of the present embodiment. FIGS. 18 and 19 are schematic cross-sectional views illustrating the structure of the MISFET implemented as the semiconductor device of the present embodiment. FIG. 18 is a cross-sectional view parallel with the channel direction, and FIG. 19 is a cross-sectional view perpendicular to the channel direction.

The MISFET of the present embodiment is an n-type MISFET that uses electrons as carriers.

The MISFET is a lateral MISFET having the fin structure in which the gate insulating film and the gate electrode are formed on the narrow portion of the SiC layer. In the following, the SiC layer including the channel forming surface inclined at an angle of from 0 degree to 30 degrees relative to the {11-20} face will be described as an example.

The MISFET includes an SiC layer 51. The SiC layer 51 has the 4H—SiC structure. The SiC layer 51 has first and second planes. The second plane is formed on the side of the SiC layer 51 opposite to the first plane. In FIGS. 17 to 19, the first plane is the upper surface of the SiC layer 51, and the second plane is the lower surface of the SiC layer 51.

In the following, the SiC layer that includes the first plane inclined at an angle from 0 degree to 30 degrees relative to the {0001} face (Si-face), and the second plane opposite to the first plane and inclined at an angle from 0 degree to 30 degrees relative to the {000-1} face (C-face) will be described as an example. For example, the first plane of the SiC layer 51 is inclined at an angle from 0 degree to 30 degrees relative to the (0001) face (Si-face). The second plane of the SiC layer 51 is inclined at an angle from 0 degree to 30 degrees relative to the (000-1) face (C-face).

In the SiC layer 51, a p-type region 54, the n⁻-type drift layer (n-type second SiC region) 14, the n⁺-type source region (n-type first SiC region) 18, the p-type contact region 20, and an n⁺-type drain region 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 includes the narrow portion 70 and the wide portion 72 wider than the narrow portion on the side of the first plane.

In the SiC layer 51, the p-type region 54 having an impurity concentration of the p-type impurity of, for example, from $1 \times 10^{16}$ cm$^{-3}$ to $5 \times 10^{17}$ cm$^{-3}$ is formed.

On a part of the surface of the p-type region 54, the n⁻-type drift layer 14 having an impurity concentration of the n-type impurity of, for example, from $5 \times 10^{15}$ cm$^{-3}$ to $2 \times 10^{16}$ cm$^{-3}$ is formed. A depth of the drift layer 14 is, for example, 1.0 μm.

On a part of the surface of the p-type region 54, the n⁺-type source region (n-type first SiC region) 18 and the n⁺-type drain region 56, both having an impurity concentration of the n-type impurity of, for example, from $1 \times 10^{18}$ cm$^{-3}$ to $1 \times 10^{22}$ cm$^{-3}$ are formed. A depth of the source region 18 and the n⁺-type drain region 56 is smaller than that of the drift layer 14, and is, for example, about 0.3 μm. The n⁺-type source region 18 and the n⁻-type drift region 14 are formed across the p-type region 54.

On a part of the surface of the p-type region 54 and on the side of the source region 18, the p⁺-type contact region 20 having an impurity concentration of the p-type impurity of, for example, from $1 \times 10^{18}$ cm$^{-3}$ to $1 \times 10^{22}$ cm$^{-3}$ is formed. A depth of the p-type contact region 20 is smaller than that of the drift layer 14 and is, for example, about 0.3 μm.

The channel forming surface 40 is included in the side face of the narrow portion 70. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the n⁺-type source region (n-type first SiC region) 18 and the n⁻-type drift layer (n-type second SiC region) 14. The channel forming region 42 is formed in the p-type region 54 of the narrow portion 70. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The channel forming region 42 of the present embodiment is in a direction of a line segment formed by connecting such points as to minimize a distance between the n⁺-type source region (n-type first SiC region) 18 and the n⁻-type drift layer (n-type second SiC region) 14 in the channel forming surface 40. In FIG. 17, the direction of the channel forming region 42 is indicated by a white arrow. The channel forming region 42 is in a direction of, for example, the [1-100] direction.

The MISFET includes the conductive source electrode (first electrode) 34 electrically connected to the source region 18 and the p-type contact region 20 on the side of the first plane of the SiC layer 51. The source electrode 34 also functions as a p-type contact electrode that applies a potential to the p-type region 54.

On the side of the first plane of the SiC layer 51, the conductive drain electrode (second electrode) 36 electrically connected to the n⁻-type drift layer (n-type second SiC region) 14 and the drain region 56 is formed.

Similarly to the third embodiment, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized. The MISFET of the present embodiment includes the fin structure, and can suppress short channel effect. As a result, the gate length of the MISFET can be decreased. Accordingly, a highly miniaturized or integrated semiconductor device is realized. Since the drift layer 14 is included, a semiconductor device having high pressure resistance is realized.

Although the example of the SiC layer including the channel forming surface inclined at an angle from 0 degree to 30 degrees relative to the {11-20} face (a-face) has been described, the SiC layer including the channel forming surface inclined at an angle from 0 degree to 30 degrees relative to the {1-100} face (m-face) may also be used. With such an SiC layer, the semiconductor device with small on-resistance is also realized.

Further, the example of the SiC layer including the first plane inclined at an angle from 0 degree to 30 degrees relative to the {0001} face (Si-face) and the second plane opposite to the first plane and inclined at an angle from 0 degree to 30 degrees relative to the {000-1} face (C-face) has been described above. However, the SiC layer including the first plane inclined at an angle from 0 degree to 30 degrees relative to the {000-1} face (C-face) and the second plane opposite to the first plane and inclined at an angle from 0 degree to 30 degrees relative to the {0001} face (Si-face) may also be used. With such an SiC layer, the semiconductor device with small on-resistance is also realized.

Eleventh Embodiment

The semiconductor device of the present embodiment is a lateral MISFET that includes source and drain regions on the same plane. The semiconductor device differs from that of the tenth embodiment in that a drift layer is not included. In the following, what are similar to those of the tenth embodiment will not be repeated.

Figure 20:
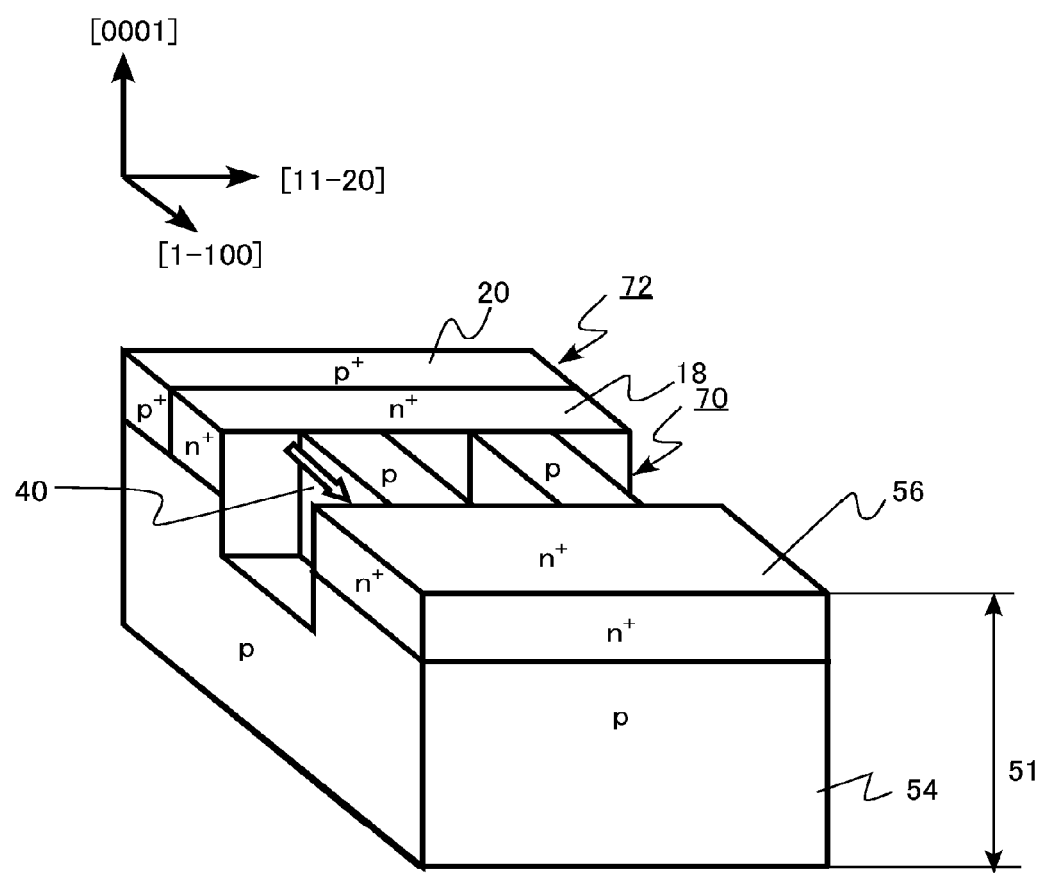
FIG. 20 is a schematic perspective view of a semiconductor device of an eleventh embodiment.
Figure 21:
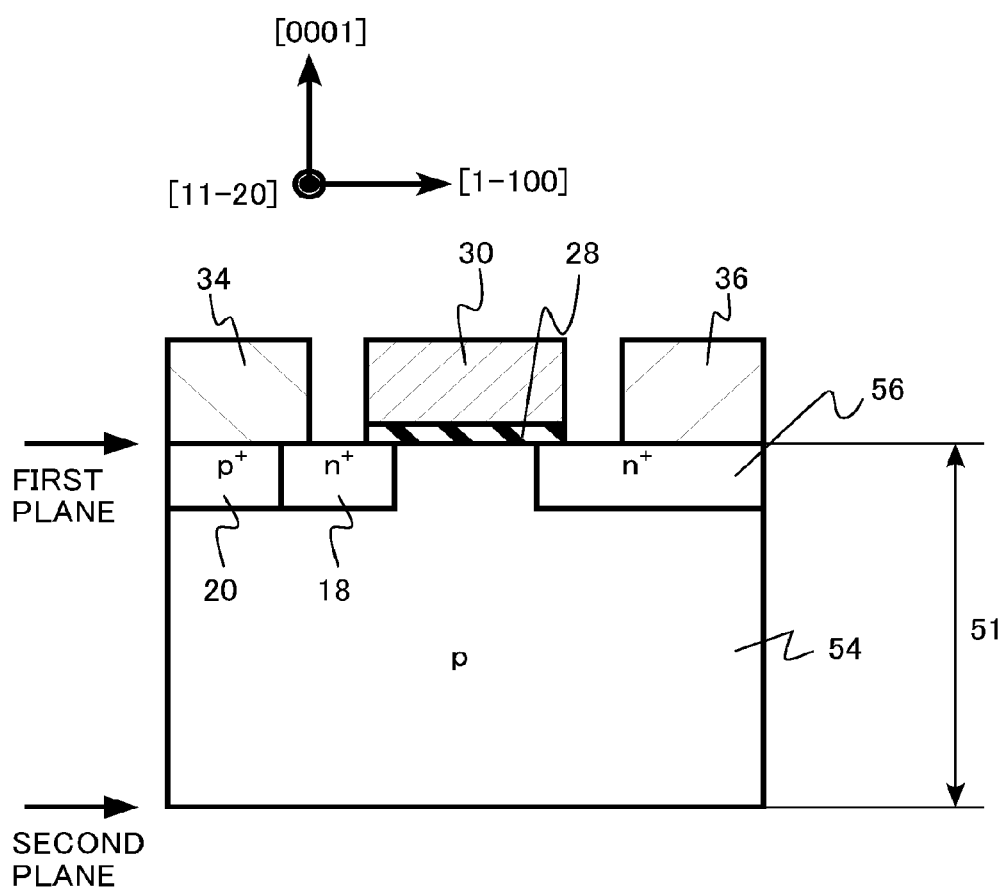
FIG. 21 is a schematic cross-sectional view of a semiconductor device of the eleventh embodiment.
Figure 22:
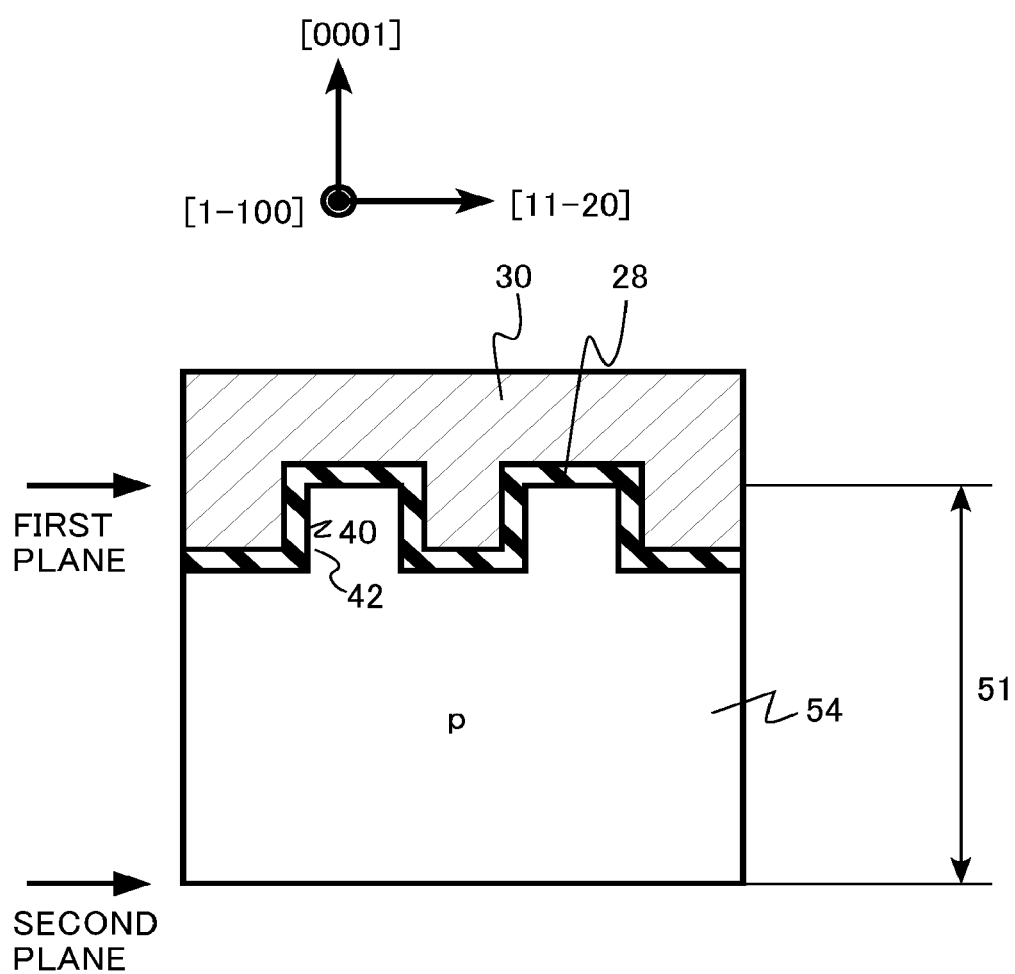
FIG. 22 is a schematic cross-sectional view of a semiconductor device of the eleventh embodiment.

FIG. 20 is a schematic perspective view illustrating the structure of a MISFET implemented as the semiconductor device of the present embodiment. FIGS. 21 and 22 are schematic cross-sectional views illustrating the structure of the MISFET implemented as the semiconductor device of the present embodiment. FIG. 21 is a cross-sectional view parallel with the channel direction, and FIG. 22 is a cross-sectional view perpendicular to the channel direction.

The MISFET of the present embodiment is an n-type MISFET that uses electrons as carriers.

The MISFET is a lateral MISFET having the fin structure in which the gate insulating film and the gate electrode are formed on the narrow portion of the SiC layer. In the following, the SiC layer including the channel forming surface inclined at an angle of from 0 degree to 30 degrees relative to the {11-20} face will be described as an example.

The MISFET includes an SiC layer 51. The SiC layer 51 has the 4H—SiC structure. The SiC layer 51 has first and second planes. The second plane is formed on the side of the SiC layer 51 opposite to the first plane. In FIGS. 20 to 22, the first plane is the upper surface of the SiC layer 51, and the second plane is the lower surface of the SiC layer 51.

In the following, the SiC layer that includes a first plane inclined at an angle from 0 degree to 30 degrees relative to the {0001} face (Si-face), and a second plane opposite to the first plane and inclined at an angle from 0 degree to 30 degrees relative to the {000-1} face (C-face) will be described as an example. For example, the first plane of the SiC layer 11 is inclined at an angle from 0 degree to 30 degrees relative to the (0001) face (Si-face). The second plane of the SiC layer 11 is inclined at an angle from 0 degree to 30 degrees relative to the (000-1) face (C-face).

In the SiC layer 51, the p-type region 54, the n⁺-type source region (n-type first SiC region) 18, the p-type contact region 20, and the n⁺-type drain region (n-type second SiC region) 56 are formed. The MISFET also includes the gate insulating film 28, the gate electrode 30, the source electrode (first electrode) 34, the drain electrode (second electrode) 36, the channel forming surface 40, and the channel forming region 42.

The SiC layer 51 includes the narrow portion 70 and the wide portion 72 wider than the narrow portion 70 on the side of the first plane.

The channel forming surface 40 is included in the side face of the narrow portion 70. The gate insulating film 28 is formed between the channel forming surface 40 and the gate electrode 30.

The channel forming region 42 is formed on the side of the SiC layer 51 of the channel forming surface 40 in the SiC layer 51. The channel forming region 42 is formed between the n⁺-type source region (n-type first SiC region) 18 and the n⁺-type drain region (n-type second SiC region) 56. The channel forming region 42 is formed in the p-type region 54 of the narrow portion 70. When the MISFET is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The direction of the channel forming region 42 of the present embodiment is the direction of a line segment formed by connecting such points as to minimize a distance between the n⁺-type source region (n-type first SiC region) 18 and the n⁺-type drain region (n-type second SiC region) 56 in the channel forming surface 40. In FIG. 20, the direction of the channel forming region 42 is indicated by a white arrow. The channel forming region 42 is in a direction of, for example, the [1-100] direction.

Similarly to the tenth embodiment, the MISFET of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The MISFET with high channel mobility can be realized. Accordingly, the semiconductor device having small on-resistance is realized. The MISFET of the present embodiment includes the fin structure, and can suppress short channel effect. As a result, the gate length of the MISFET can be decreased. Accordingly, a highly miniaturized or integrated semiconductor device is realized.

Although the example of the SiC layer including the channel forming surface inclined at an angle from 0 degree to 30 degrees relative to the {11-20} face (a-face) has been described, the SiC layer including the channel forming surface inclined at an angle from 0 degree to 30 degrees relative to the {1-100} face (m-face) may also be used. With such an SiC layer, the semiconductor device with small on-resistance is also realized.

Further, the example of the SiC layer including the first plane inclined at an angle from 0 degree to 30 degrees relative to the {0001} face (Si-face) and the second plane opposite to the first plane and inclined at an angle from 0 degree to 30 degrees relative to the {000-1} face (C-face) has been described above. However, the SiC layer including the first plane inclined at an angle from 0 degree to 30 degrees relative to the {000-1} face (C-face) and the second plane opposite to the first plane and inclined at an angle from 0 degree to 30 degrees relative to the {0001} face (Si-face) may also be used. With such an SiC layer, the semiconductor device with small on-resistance is also realized.

Twelfth Embodiment

A semiconductor device of the present embodiment includes an SiC layer of 4H—SiC structure having a channel forming surface inclined at an angle from 0 degree to 30 degrees relative to {11-20} face or {1-100} face, a gate electrode, a gate insulating film formed between the channel forming surface and the gate electrode, a n-type first SiC region formed in the SiC layer, a n-type second SiC region formed in the SiC layer, and a channel forming region formed on the side of the SiC layer of the channel forming surface and in the SiC layer between the first SiC region and the second SiC region, and having a direction inclined at an angle from 60 degrees to 90 degrees relative to the <0001> direction or the <000-1> direction.

The semiconductor device of the present embodiment includes an SiC layer including a first plane inclined at an angle from 0 degree to 30 degrees relative to the {1-100} face, and a second plane opposite to the first plane and inclined at an angle from 0 degree to 30 degrees relative to the {1-100} face. The channel forming surface is formed between the first and second planes, with the channel forming surface inclined at an angle from 0 degree to 30 degrees relative to the {11-20} face. The gate insulating film and the gate electrode are formed in the SiC layer. The semiconductor device also includes a first electrode formed on the side of the first plane and electrically connected to the first SiC region and a second electrode formed on the side of the second plane and electrically connected to the second SiC region.

The semiconductor device of the present embodiment further includes a third p-type SiC region between the SiC layer and the second electrode.

Figure 23:
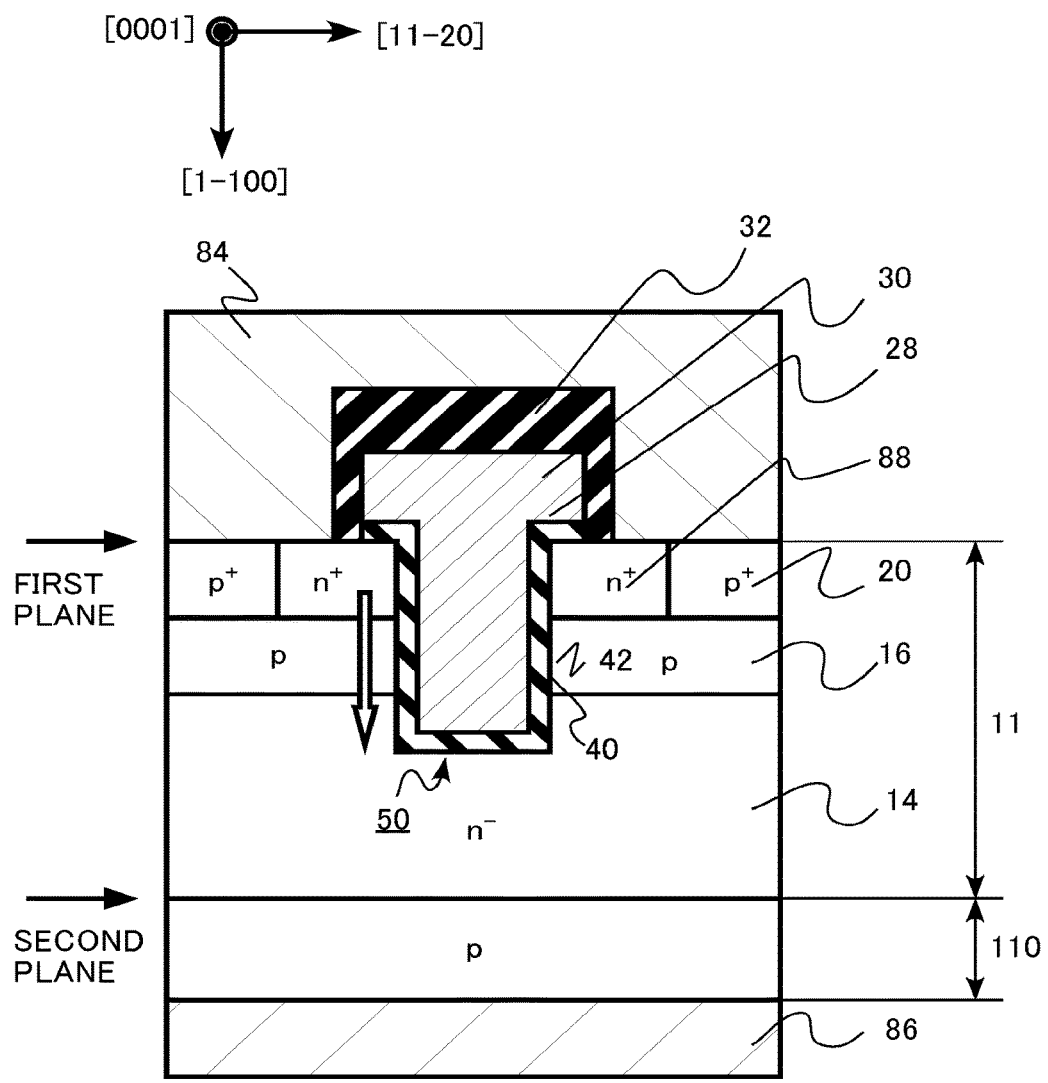
FIG. 23 is a schematic cross-sectional view of a semiconductor device of a twelfth embodiment.

FIG. 23 is a schematic cross-sectional view illustrating the structure of an insulated gate bipolar transistor (IGBT) implemented as the semiconductor device of the present embodiment. The IGBT of the present embodiment is a vertical IGBT having a trench gate structure in which the gate insulating film and the gate electrode are formed in a trench.

The IGBT of the present embodiment differs from the first embodiment in that the p-type SiC substrate is included, instead of the n-type SiC substrate of the MISFET of the first embodiment. In the following, what are similar to those of the first embodiment will not be repeated.

The IGBT includes a p-type SiC substrate (third p-type SiC region) 110 and the SiC layer 11. In the SiC layer 11, the n⁻-type drift layer (n-type second SiC region) 14, the p-type base region 16, an n⁺-type emitter region (n-type first SiC region) 88, and the p⁺-type base contact region 20 are formed. The IGBT also includes the gate insulating film 28, the gate electrode 30, the interlayer insulating film 32, an emitter electrode (first electrode) 84, a collector electrode (second electrode) 86, and the channel forming surface 40, the channel forming region 42, and the trench 50.

For example, the p-type SiC substrate 110 may be an SiC substrate of 4H—SiC including the p-type impurity, such as aluminum (Al), at an impurity concentration of, for example, from $1 \times 10^{18}$ cm$^{-3}$ to $1 \times 10^{20}$ cm$^{-3}$. A top surface side of the p-type SiC substrate 110 is a plane inclined at an angle from 0 degree to 30 degrees relative to (−1100) face (m-face). A back surface side of the p-type SiC substrate 110 is a plane inclined at an angle from 0 degree to 30 degrees relative to (1-100) face (m-face).

The SiC layer 11 has the 4H—SiC structure. The SiC layer 11 has first and second planes. The second plane is formed on the side of the SiC layer 11 opposite to the first plane. In FIG. 1, the first plane is the upper surface of the SiC layer 11, and the second plane is the lower surface of the SiC layer 11.

The first plane of the SiC layer 11 is inclined at an angle from 0 degree to 30 degrees relative to the (−1100) face. The second plane of the SiC layer 11 is inclined at an angle from 0 degree to 30 degrees relative to the (1-100) face.

On the SiC substrate 110, the n⁻-type drift layer (n-type second SiC region) 14 having an impurity concentration of the n-type impurity of, for example, from $5 \times 10^{15}$ cm$^{-3}$ to $2 \times 10^{16}$ cm$^{-3}$ is formed. The drift layer 14 is, for example, an SiC epitaxial growth layer formed by epitaxial growth on the SiC substrate 110. The drift layer 14 has a film thickness of, for example, from 5 μm to 100 μm.

In the drift layer 14, the p-type base region 16 having an impurity concentration of a p-type impurity of, for example, from $1 \times 10^{16}$ cm$^{-3}$ to $5 \times 10^{17}$ cm$^{-3}$ is formed. A depth of the base region 16 is, for example, about 0.6 μm.

On a part of the surface of the base region 16, the n⁺-type emitter region (n-type first SiC region) 88 having an impurity concentration of the n-type impurity of, for example, from $1 \times 10^{18}$ cm$^{-3}$ to $1 \times 10^{22}$ cm$^{-3}$ is formed. A depth of the emitter region 88 is smaller than that of the base region 16 and is, for example, about 0.3 μm. The n⁺-type emitter region 88 and the n⁻-type drift region 14 are formed across the base region 16.

On a part of the surface of the base region 16 and at the side of the emitter region 88, the p⁺-type base contact region 20 having an impurity concentration of the p-type impurity of, for example, from $1 \times 10^{18}$ cm$^{-3}$ to $1 \times 10^{22}$ cm$^{-3}$ is formed. A depth of the base contact region 20 is smaller than that of the base region 16 and is, for example, about 0.3 μm.

The trench 50 is formed in the surface of the SiC layer 11 in a direction toward the SiC substrate 110 from the surface of the SiC layer 11. An inner wall surface of the trench 50 is inclined at an angle from 0 degree to 30 degrees relative to the {11-20} face or the a-face.

The inner wall surface of the trench 50 becomes the channel forming surface 40. The channel forming surface 40 is formed between the first plane and the second plane.

The gate insulating film 28 and a part of the gate electrode 30 are formed in the trench 50. In other words, the gate insulating film 28 and a part of the gate electrode 30 are formed in the SiC layer 11.

The gate insulating film 28 is formed between the channel forming surface 40 and the gate electrode 30. The gate insulating film 28 includes a film such as a silicon oxide film or a silicon oxynitride film. The gate insulating film 28 may also be made of a high-k insulating film.

The high-k insulating film may include such films as a metal oxide film, a metal oxynitride film, a metal silicate film, a nitrogen added metal silicate film, or the like. Specifically, films such as an aluminum oxide film, a hafnium oxide film, an oxynitride aluminum film, an oxynitride hafnium film, an aluminosilicate film, a hafnium silicate film, a zirconium silicate film, a nitrogen added aluminosilicate film, a nitrogen added hafnium silicate film, a nitrogen added zirconium silicate film, or the like may be used.

From the point of view of suppressing a leak current of the gate insulating film 28, it is preferable to use a film having a larger band gap, such as the silicon oxide film or the silicon nitride film, than that of the high-k insulating film.

From a point of view of decreasing an interface state of the interface between the gate insulating film 28 and the SiC layer 11, a nitride layer may be formed at the interface between the gate insulating film 28 and the SiC layer 11.

The channel forming region 42 is formed on the side of the SiC layer 11 of the channel forming surface 40 in the SiC layer 11. The channel forming region 42 is formed between the $n^+$-type emitter region (n-type first SiC region) 88 and the $n^-$-type drift layer (n-type second SiC region) 14. The channel forming region 42 is formed in the base region 16. When the IGBT is turned on, an inversion layer is formed in the channel forming region 42 and electrons flow as carriers.

The channel forming region 42 has a direction inclined at an angle from 60 degrees to 90 degrees relative to the <0001> direction or the <000-1> direction. The direction of the channel forming region is defined as a direction of a line segment formed by connecting such points as to minimize a distance between the n-type impurity region on the side of the source of the transistor and the n-type impurity region on the side of the drain of the transistor in the channel forming surface.

The direction of the channel forming region 42 of the present embodiment is the direction of a line segment formed by connecting such points as to minimize a distance between the $n^+$-type emitter region (n-type first SiC region) 88 and the $n^-$-type drift layer (n-type second SiC region) 14 in the channel forming surface 40. In FIG. 23, the direction of the channel forming region 42 is indicated by a white arrow. The channel forming region 42 is in a direction of, for example, the [1-100] direction.

The gate electrode 30 may be made of, for example, doped polysilicon. The gate electrode 30 may be made of, for example, metal or metal silicide. On the gate electrode 30, the interlayer insulating film 32 made of, for example, the silicon oxide film is formed.

The IGBT includes a conductive emitter electrode (first electrode) 84 electrically connected to the emitter region 88 and the base contact region 20 on the side of the first plane of the SiC layer 11. The emitter electrode 84 also functions as a base electrode that applies a potential to the base region 16.

The emitter electrode 84 is made of, for example, metal. The source electrode 34 has a layered structure of, for example, a nickel (Ni) layer and an aluminum layer. SiC may be reacted with the nickel layer to create nickel silicide. Similarly, the nickel layer and the aluminum layer may be reacted with each other to form an alloy.

On the side of the second plane of the SiC layer 11 and on the side of the SiC substrate 110 opposite to the drift layer 14, a conductive collector electrode (second electrode) 86 electrically connected to the drift layer 14 and the SiC substrate 110 is formed.

The collector electrode 86 is made of, for example, metal. The source electrode 34 has a layered structure of, for example, a nickel (Ni) layer and an aluminum layer. SiC may be reacted with the nickel layer to create nickel silicide. Similarly, the nickel layer and the aluminum layer may be reacted with each other to form an alloy.

In the present embodiment, nitrogen (N) or phosphorus (P) is preferably used as the n-type impurity, but arsenic (As) or antimony (Sb) may also be used. Aluminum (Al) is preferably used as the p-type impurity, but boron (B), gallium (Ga), or indium (In) may also be used.

The IGBT of the present embodiment has the channel forming surface 40 inclined at an angle from 0 degree to 30 degrees relative to the {11-20} face (a-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <1-100> direction.

The IGBT with high channel mobility can be realized. Accordingly, the semiconductor device having small on-resistance is realized. Further, the IGBT of the present embodiment has the trench gate structure, such that a highly miniaturized or integrated semiconductor device is realized.

From a point of view of improving the channel mobility, the channel forming surface 40 may preferably be inclined at an angle from 0 degree to 15 degrees relative to the {1-100} face (m-face), while the channel forming region 42 may preferably have a direction inclined at an angle from 75 degrees to 90 degrees relative to the <0001> direction (c-axis direction) or the <000-1> direction. Further, from a point of view of improving the channel mobility, the channel forming surface 40 may preferably be inclined at an angle from 0 degree to 5 degrees relative to the {1-100} face (m-face), while the channel forming region 42 may preferably have a direction inclined at an angle from 85 degrees to 90 degrees relative to the <0001> direction (c-axis direction) or the <000-1> direction.

Thirteenth Embodiment

A semiconductor device of the present embodiment includes an SiC layer including a first plane inclined at an angle from 0 degree to 30 degrees relative to the {11-20} face, and a second plane opposite to the first plane and inclined at an angle from 0 degree to 30 degrees relative to the {11-20} face. The channel forming surface is formed between the first and second planes, with the channel forming surface inclined at an angle from 0 degree to 30 degrees relative to the {1-100} face. The gate insulating film and the gate electrode are formed in the SiC layer. The semiconductor device also includes a first electrode formed on the side of the first plane and electrically connected to the first SiC region, and a second electrode formed on the side of the second plane and electrically connected to the second SiC region.

The semiconductor device of the present disclosure differs from that of the twelfth embodiment in the directions of the first plane, the second plane, the channel forming surface, and the channel forming region. In the following, what are similar to those of the twelfth embodiment will not be repeated.

Figure 24:
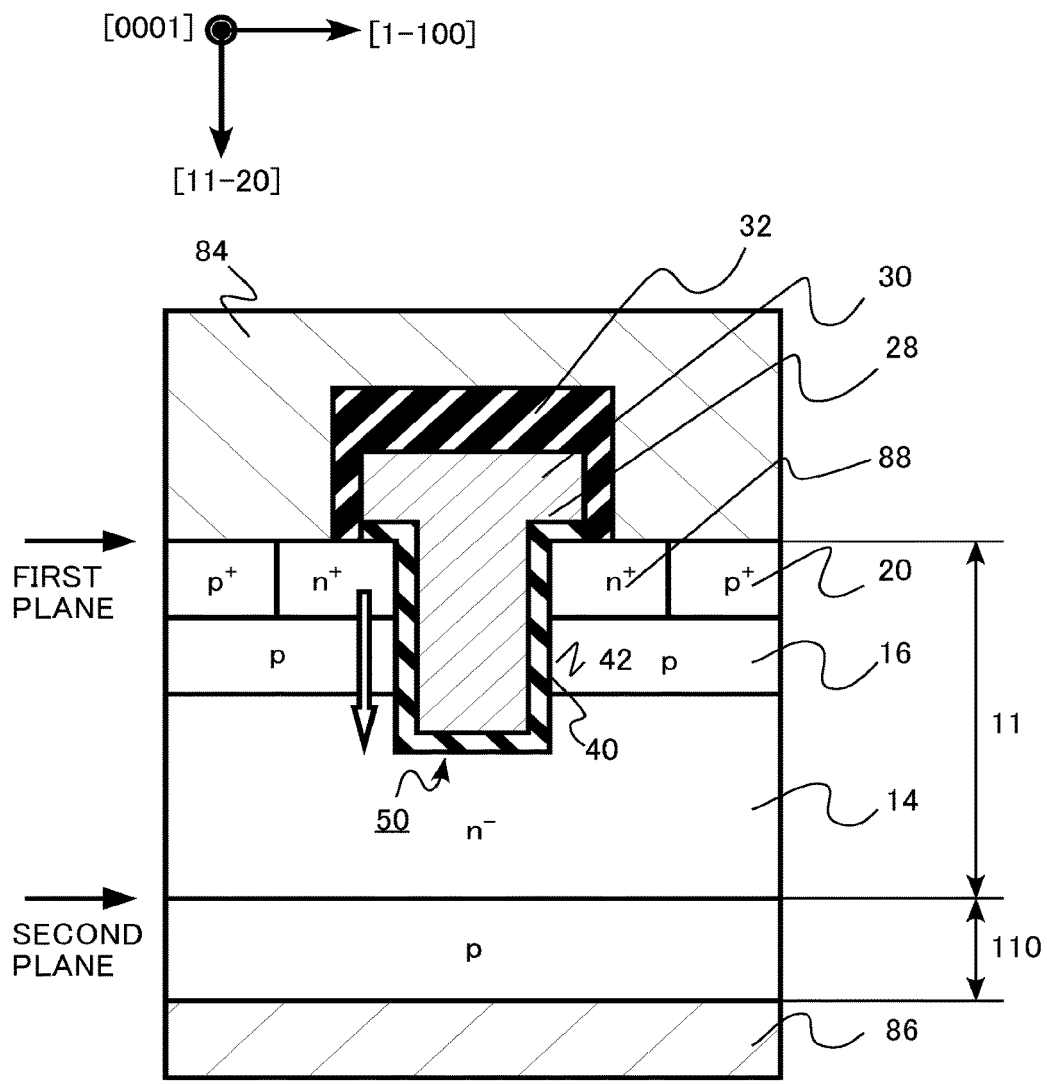
FIG. 24 is a schematic cross-sectional view of a semiconductor device of a thirteenth embodiment.

FIG. 24 is a schematic cross-sectional view illustrating the structure of an IGBT implemented as the semiconductor device of the present embodiment. The IGBT of the present embodiment is a vertical IGBT having a trench gate structure in which the gate insulating film and the gate electrode are formed in a trench.

The IGBT of the present embodiment has the channel forming surface 40 inclined at an angle from 0 degree to 30 degrees relative to the {1-100} face (m-face). The channel forming region 42 has a direction inclined at an angle from 60 degrees to 90 degrees relative to the <0001> direction (c-axis direction) or the <000-1> direction. In other words, the channel forming region 42 has a direction inclined at an angle from 0 degree to 30 degrees relative to the <11-20> direction.

The IGBT with high channel mobility can be realized. Accordingly, the semiconductor device having small on-resistance is realized. Further, the IGBT of the present embodiment has the trench gate structure, such that a highly miniaturized or integrated semiconductor device is realized.

From a point of view of improving the channel mobility, the channel forming surface 40 may preferably be inclined at an angle from 0 degree to 15 degrees relative to the {11-20} face (a-face), while the channel forming region 42 may preferably have a direction inclined at an angle from 75 degrees to 90 degrees relative to the <0001> direction (c-axis direction) or the <000-1> direction. Further, from a point of view of improving the channel mobility, the channel forming surface 40 may preferably be inclined at an angle from 0 degree to 5 degrees relative to the {11-20} face (a-face), while the channel forming region 42 may preferably have a direction inclined at an angle from 85 degrees to 90 degrees relative to the <0001> direction (c-axis direction) or the <000-1> direction.

Although the IGBT having the trench gate structure has been described in the above embodiment, the embodiment of the present disclosure may also be applied to a vertical IGBT or a lateral IGBT without the trench structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
an SiC layer of 4H—SiC structure, the SiC layer having a first plane and a second plane, the second plane being disposed at an opposite side of the SiC layer to the first plane, the first plane being inclined at an angle from 0 degree to 30 degrees relative to the {11-20} face, the second plane being inclined at an angle from 0 degree to 30 degrees relative to the {11-20} face, and the SiC layer having a surface provided between the first plane and the second plane, the surface being inclined at an angle from 0 degree to 15 degrees relative to the {1-100} face;
a gate electrode provided in the SiC layer;
a gate insulating film provided between the surface and the gate electrode, the gate insulating film being provided in the SiC layer;
an n-type first SiC region provided in the SiC layer;
an n-type second SiC region provided in the SiC layer;
a channel forming region provided in the SiC layer between the first SiC region and the second SiC region, the channel forming region provided adjacent to the surface, the channel forming region having a direction inclined at an angle from 75 degrees to 90 degrees relative to a <0001> direction or a <000-1> direction, the direction of the channel forming region being defined as a direction of a line segment formed by connecting such points as to minimize a distance between the first SiC region and the second SiC region in the channel forming surface;
a first electrode electrically connected to the first SiC region; and
a second electrode electrically connected to the second SiC region, at least a part of the SiC layer being interposed between the first electrode and the second electrode.

2. The semiconductor device according to claim 1, wherein the channel forming region is p-type.

3. The semiconductor device according to claim 1, wherein the gate insulating film includes a silicon oxide film or a silicon oxynitride film.

4. The semiconductor device according to claim 1, further comprising a p-type third SiC region between the SiC layer and the second electrode.

* * * * *